(12) United States Patent
Brown et al.

(10) Patent No.: US 8,049,560 B2
(45) Date of Patent: Nov. 1, 2011

(54) INCREASING THE DENSITY OF LARGER MAGNITUDE AMPLIFIER OUTPUT SAMPLES FOR ESTIMATING A MODEL OF DIGITAL PRE-DISTORTION TO COMPENSATE FOR AMPLIFIER NON-LINEARITY

(76) Inventors: Philip Brown, Harrogate (GB); John Ibison, Great Missenden (GB); Jeremy Segar, Wheatley (GB); Stephen Cooper, Pitstone (GB); Frank Friedman, Owings Mills, MD (US)

( * ) Notice: Subject to any disclaimer, the term of this patent is extended or adjusted under 35 U.S.C. 154(b) by 0 days.

(21) Appl. No.: 12/832,239

(22) Filed: Jul. 8, 2010

(65) Prior Publication Data

US 2010/0289575 A1  Nov. 18, 2010

Related U.S. Application Data

(63) Continuation of application No. 12/616,467, filed on Nov. 11, 2009, now Pat. No. 8,030,997.

(60) Provisional application No. 61/113,389, filed on Nov. 11, 2008.

(51) Int. Cl.
   *H03F 1/26* (2006.01)
(52) U.S. Cl. ...................................... 330/149

(58) Field of Classification Search .................. 330/149; 455/114.3
See application file for complete search history.

(56) References Cited

U.S. PATENT DOCUMENTS

| | | | |
|---|---|---|---|
| 5,867,065 A | 2/1999 | Leyendecker | |
| 6,798,843 B1 | 9/2004 | Wright et al. | |
| 6,903,604 B2 | 6/2005 | Kim | |
| 7,042,286 B2 | 5/2006 | Meade et al. | |
| 7,068,102 B2 | 6/2006 | Hwang et al. | |
| 7,288,988 B2 * | 10/2007 | Braithwaite | .................. 330/149 |

OTHER PUBLICATIONS

Paige et al., "LSQR: An Algorithm for Sparse Linear Equations and Sparse Least Squares," ACM Transactions on Mathematical Software, Mar. 1982, pp. 43-71, vol. 8 No. 1.

* cited by examiner

*Primary Examiner* — Steven J Mottola
(74) *Attorney, Agent, or Firm* — The Webb Law Firm

(57) ABSTRACT

A digital pre-distortion system which can provide the flexibility to model the highly non-linear distortion associated with High Efficiency RF Power Amplifiers while through a novel implementation of a least squares estimation process allows an implementation well suited for an FPGA application where limited resources and in particular memory resources are available.

1 Claim, 16 Drawing Sheets

US 8,049,560 B2

INCREASING THE DENSITY OF LARGER MAGNITUDE AMPLIFIER OUTPUT SAMPLES FOR ESTIMATING A MODEL OF DIGITAL PRE-DISTORTION TO COMPENSATE FOR AMPLIFIER NON-LINEARITY

CROSS-REFERENCE TO RELATED APPLICATIONS

This application claims the benefit of U.S. Provisional Application No. 61/113,389, filed Nov. 11, 2008, which is hereby incorporated by reference in its entirety.

This application is a continuation of U.S. patent application Ser. No. 12/616,467, filed Nov. 11, 2009 now U.S. Pat. No. 8,030,997, which is hereby incorporated by reference in its entirety.

BACKGROUND OF THE INVENTION

1. Field of the Invention

The invention relates broadly to the field of RF transmitters for Wireless Communications applications and in particular the issues associated with RF power amplifier linearization.

2. Description of Related Art

As Wireless Communications standards evolve to support greater spectral efficiency and bandwidth they make use of advanced modulation approaches such as CDMA and OFDM which have high Peak to Average power ratios, typically in the range of 10 dB, i.e., the peak RF power is 10 dB greater than the average power. This requires the transmitter RF power amplifier to have sufficient peak power capability to support the high power peaks while operating on average at much lower power levels.

RF power amplifiers have a non-linear RF gain and phase characteristic verses RF output power which becomes increasingly non-linear as the RF output power approaches the PA maximum saturated output power (Psat). Power amplifier non-linearity creates distortion in the transmitter output which results in degraded signal quality and spectral re-growth. Wireless communications standards typically define transmitter spectral emission requirements and metrics of signal quality such as EVM or equivalent. Power amplifier non-linearity may result in the transmitter failing to meet these standard defined spectral emissions or signal quality requirements. Two possible approaches may resolve the non-linearity problem: 1) Operate the RF power amplifier at sufficiently low average RF power relative to the PA saturated power capability to ensure the PA is exercised over a range where the non-linearity is acceptable. 2) Use some form of linearization approach to correct the power amplifier non-linearity. The disadvantages of the first approach include poor efficiency; class AB power amplifier efficiency degrades as the average output power is backed-off further from Psat, and the additional cost incurred in providing a power amplifier with higher peak power capability. This invention details a new approach to power amplifier linearization that incorporates pre-distortion.

Pre-distortion corrects the power amplifier non-linearity by applying a non-linear function (we-distorting) the input signal to the power amplifier such that the cascade of the pre-distortion non-linear function and the power amplifier non-linearity has an overall linear characteristic, or at least is closer to linear than the original power amplifier characteristic. The goal in a wireless communications system is to achieve sufficient linearity to comply with the standard defined spectral mask and signal quality metrics while operating the PA at a lower back-off level than could otherwise be achieved, therefore optimizing the transmitter efficiency and peak power capability.

The new approach proposed is based on digital pre-distortion meaning the non-linear pre-distortion function is applied in the digital domain then applied to a digital to analogue converter and up-converted to RF and then applied to the power amplifier input. The optimisation of the pre-distortion function is performed by sampling the power amplifier output, down-converting and applying to an analogue to digital converter. This digital signal is then further processed by a pre-distorter estimator in order to optimise the pre-distorter non-linear function to minimize the power amplifier distortion.

In broad terms digital pre-distortion approaches can be split into two classes, memory-less and those which compensate for memory effects. RF power amplifiers, and particularly when operated with wide bandwidth signals, exhibit a non-linear distortion characteristic which is not time invariant, but rather is dependent upon the history of the previous output power. Pre-distortion techniques which seek to model the non time invariant nature of the power amplifier distortion are classed as memory methods, those which do not as memory-less methods.

In order to improve power amplifier efficiency it is desirable to adopt power amplifier architectures such as 2-way and 3-way Doherty. These power amplifier architectures may offer significantly higher power amplifier efficiency, but experimentally they may exhibit higher levels of non-linear distortion compared to class AB architectures, and may present more significant memory effects when supporting instantaneous bandwidth requirements commonly required by modern wireless communications standards. Commercial factors for improving power amplifier efficiency include a strong desire to improve system efficiency to both minimize the end users energy costs and reduce thermal dissipation to allow for convection cooling deployment scenarios as opposed to forced air cooling, again saving cost. Therefore it is highly desirable to implement the invention disclosed herein of a pre-distortion system which corrects for memory effects in order to support the use of high efficiency power amplifier architectures such as Doherty.

Digital pre-distortion approaches including those which address memory effects can be split into techniques based on a polynomial pre-distorter model or approaches using table based approaches.

U.S. Pat. No. 6,903,604 describes a good example of a polynomial based approach which also addresses memory effects. Typically with high efficiency Doherty amplifiers, as discussed previously, they exhibit a highly non-linear response with discontinuities apparent over a wide dynamic range which to model accurately would require a relatively high order polynomial. The computational complexity and therefore time required in a typical commercial application to optimise the polynomial model is adversely affected as polynomial order is increased. It is also widely understood that numerical stability is degraded with increased polynomial order. An alternative approach based on a multi-dimensional table structure is detailed in U.S. Pat. No. 6,798,843. This approach avoids the issues associated with the higher order polynomials but requires significant computational resource.

SUMMARY OF THE INVENTION

At least for commercial reasons it is highly desirable to implement all of the digital aspects of a pre-distortion function including application of the pre-distorter and optimization of the pre-distorter coefficients entirety within a Field-Programmable Gate Array (FPGA) or equivalent technology. In addition, it is desirable that the FPGA resource requirements should be minimised to optimise the implementation cost.

The invention includes a digital pre-distortion correction system which can be optimised for efficient implementation within an FPGA device such as the Xilinx Virtex-5 FPGA family. The digital pre-distortion correction system is typically incorporated within a wireless communications RF transmitter in order to correct the non-linear distortion associated with the RF power amplifier.

A wireless communications network, such as a network that uses CDMA modulation, may include a variety of wireless communication points (e.g. handsets, RF transmitters, base station receivers, and the like). When embodied in association with a RF transmitter in a wireless network, the invention may facilitate communication among handsets within the network.

The digital pre-distortion system may include a pre-distorter block which applies a non-linear function to the signal desired for transmission. The signal desired for transmission is assumed to be in a complex digital baseband form and is created by an appropriate modem. The pre-distorter block may include a non-linear FIR filter and as such is implemented by creating a number of time delayed versions of the input signal each with distinct delays and applying a non-linear function independently to each time delayed version in addition to the original input signal. The non-linear function applied to the input signal and the delayed replica's is implemented in the form of a look up table of complex coefficients indexed by the magnitude of the input signal to the individual look up table. The output of the pre-distortion block is formed by summing together the outputs of the non-linear functions applied to the original and time delayed input signals. The pre-distorter block described is capable of modelling a time variant non-linear function and hence is capable of addressing power amplifier memory effects The output of the pre-distortion block is optionally applied to a QMC block. The block may be required if the RF up-converter includes a direct complex to RF up-conversion. The QMC block applies an independent gain scaling to the real and imaginary data. In addition the block allows for a portion of the real data to be summed into the imaginary data and also for a portion of the imaginary data to be summed into the real data. With appropriate scaling values, this structure can compensate for the real and imaginary gain imbalance and real and imaginary phase error found in practical direct complex to RF up-converters. These effects if uncompensated have a negative impact on the digital pre-distortion performance and in general to the transmitter signal quality.

The output of the QMC block is processed by a digital to analogue converter and converted to an RF signal by the RF up-converter block. The RF up-converter block may take a number of forms including a direct complex to RF up-conversion or may be an IF based up-conversion. In the case of IF based up-conversion a digital multiplication stage may be required prior to the digital to analogue conversion to convert the complex digital stream to a real digital stream at an appropriate intermediate frequency.

The RF signal from the RF up-converter is applied to the RF power amplifier. The output of the power amplifier is passed to a coupler which allows a small portion of the power amplifier output to be monitored for the purposes of optimising the digital pre-distortion system. The coupled output of the power amplifier is processed to an RF down-converter which either converts the RF signal to a complex baseband form or to a sufficiently low intermediate frequency to allow sampling with an analogue to digital converter. The feedback signal is processed by either a complex or real ADC to create a digital feedback signal.

The digital feedback signal is passed to a capture block. The capture system monitors a number of parameters of the transmit signal in order to identify portions of the feedback signal which are most relevant for optimization of the pre-distortion system. When the capture system identifies a relevant portion of the transmit signal it stores the corresponding feedback signal and pre-distorter output signal within a memory for processing by the estimation block. In order to limit the demand on deployment resources, such as FPGA memory requirements, the capture system is configured to limit the number of samples to be stored; in a typical implementation this limitation would be 1K complex samples per signal. Such a small portion of the feedback signal may provide insufficient information when viewed by itself in terms of the power amplifier characteristics relevant to pre-distortion optimization, and in particular for a memory based pre-distortion solution where the power amplifier performance verses time is not invariant.

The capture block alerts the estimation block when it has a set of samples for processing. A task for the estimator block is to prepare the signals by compensating for the time delay, gain and phase change of the feedback signal when compared to the output of the pre-distortion block.

The estimation block processes the feedback signal as well as the output of the pre-distortion block in order to optimise the non-linear functions within the pre-distorter block and parameters of the QMC block. These two signals are sorted into a number of magnitude bands, typically in the range of 16-32 bands. The estimation process optimizes a simplified pre-distorter model which shares the same structure as the real time pre-distorter but where as the real-time pre-distorter may contain 128-256 distinct magnitude bands the simplified model considers a much reduced model with typically 16-32 magnitude bands which will be referred to as the estimation bands. Greater or fewer magnitude bands maybe used in the estimation model and in the pre-distorter model. The estimation process may include optimizing the complex gain values associated with each of the estimation bands in order to find the optimum complex coefficients in the least squares sense. A linear interpolation approach is then used to map the reduced number of estimation band coefficients on to the full range of magnitude bands defined in the real time look-up table (LUT). This approach limits the number of coefficients which are required to be optimised in the least squares sense to a number which is practical for optimization using limiting processor resources, such as a soft core processor within an FPGA, e.g. 16-32 bands require optimization as opposed to the 128-256 bands typically required in the real time pre-distorter. In addition this direct approach to the calculation of the pre-distortion function is ideally suited to modelling power amplifiers with highly non-linear characteristics as an arbitrary transfer function may be modelled within the constraints of the number of estimation bands.

Because of the limited number of feedback samples, typically 1k, which can be provided by the capture block (e.g. for limiting FPGA resource requirements) it may be required for the estimation block to process multiple individual captures to gather sufficient characterisation data of the power amplifier. A method has been developed to perform an optimization in the least squares sense which allows each set of captures to be individually processed to a form an intermediate result in the form of a matrix. This intermediate matrix is amended each time a set of captures is processed allowing the final least squares estimation to consider a large dataset but crucially the size of the intermediate matrix remains constant regardless of how may individual captures are processed. Therefore the estimation block can process numerous individual captures thereby optimizing the pre-distorter coefficients in the least squares sense based on a very large dataset but while still requiring limited memory resources which, for an FPGA implementation, may be thought of in terms of the working memory required by the embedded soft core processor.

A management process runs in the embedded soft core processor which may interact with an external system control processor and control and sequence operation of the components which make up the pre-distortion and QMC systems. The process can operate in two different modes, the first allowing the external system control processor to request individual functions from the digital pre-distortion (DPD) system, and the second being an autonomous tracking mode where control loop monitors the system and performs QMC and pre-distorter updates as necessary to maintain optimum performance.

In summary the invention proposes a digital pre-distortion system which can provide the flexibility to model the highly non-linear distortion associated with High Efficiency RF Power Amplifiers while through a novel implementation of a least squares estimation process allows an implementation well suited for low cost, low power, small and efficient deployment in a variety of computing environments, such as an FPGA application where limited resources and in particular memory resources are available.

In embodiments, methods and systems for adjusting the distortion of a signal for input to a radio frequency amplifier by processing the signal may be provided. The pre-distortion facility may contain one or more lookup tables of coefficients. The coefficients may be determined by linear interpolation from a subset of coefficients that may be selected based on the signal magnitude.

In embodiments, the pre-distortion facility may include a non-linear complex FIR filter. The coefficients of the non-linear complex FIR filter may be contained in the one or more lookup tables. In addition, a non-linear digital pre-distortion facility may be based on dynamically adjusted lookup tables.

In embodiments, the distortion adjustment may include applying each of one or more time-delayed samples of the signal to a lookup table to produce time-delayed results and summing the one or more time-delayed results. In addition, the distortion adjustment may include correcting amplifier magnitude non-linearity or phase non-linearity.

In embodiments, one or more coefficients may be determined using a least squares optimized model of time varying non-linearity characteristics of the amplifier or by amplifier distortion values captured at different amplifier power levels.

In embodiments, methods and systems for adjusting the distortion of a signal for input to a radio frequency amplifier may be provided. The adjustment of distortion may include processing the signal through a pre-distortion facility that may contain one or more lookup tables of coefficients that may be calculated from a subset of coefficients obtained by sampling a non-linearity characteristic of the amplifier.

In embodiments, a preferred subset of coefficients may be determined based on the signal magnitude input to the amplifier. The coefficients from the plurality of lookup tables may be calculated based on their interdependence.

In embodiments, the pre-distortion facility may include a non-linear complex FIR filter whose coefficients may be contained in one or more lookup tables.

In embodiments, the distortion adjustment may include applying each of the one or more time-delayed samples of the signal to a corresponding one or more lookup tables to produce one or more time-delayed results and summing these results. In addition, the digital pre-distortion facility may introduce non-linear characteristics into the signal. Furthermore, distortion adjustment may include correcting amplifier magnitude non-linearity or phase non-linearity.

In embodiments, the one or more coefficients may be determined using a least squares optimized model of time varying non-linearity characteristics of the amplifier. Further, the two time-delayed samples may differ from each other by at least two sample durations.

In embodiments, the sample coefficients may be derived from amplifier distortion values captured at different amplifier power levels. The coefficients may be piecewise linearly interpolated from the subset of coefficients.

In embodiments, methods and systems for amplifying a radio frequency signal may be provided. The radio frequency signal may be digitally pre-distorted to compensate for amplifier non-linearity characteristics based on coefficients. The coefficients may be linearly interpolated from a subset of sample coefficients that may be selected based on the signal magnitude.

In embodiments, the signal may be digitally pre-distorted using a pre-distortion facility that may contain one or more lookup tables containing the coefficients. The pre-distortion facility may include a non-linear complex FIR filter. The coefficients of the non-linear complex FIR filter may be contained in the one or more lookup tables. In addition, the digital pre-distortion facility may introduce non-linear characteristics into the signal.

In embodiments, the signal may digitally be pre-distorted by applying a number of time-delayed samples of the signal to a lookup table to produce time-delayed results and further summing these time-delayed results.

In embodiments, some of the coefficients may be determined using a least squares optimized model of time varying amplifier non-linearity characteristics or derived from amplifier distortion values captured at different amplifier power levels.

In embodiments, the amplifier non-linearity characteristics may include amplifier magnitude non-linearity or phase non-linearity.

In embodiments, methods and systems for digitally estimating radio frequency amplifier non-linearity characteristics may be provided. The estimation of non-linearity may be determined by using one or more magnitude differentiated amplifier samples to form a complex matrix equation. The matrix equation may produce a subset of filter coefficients suitable for interpolation that may provide a model of the inverse of the amplifier non-linearity.

In embodiments, the amplifier samples may include input signal and output signal samples.

In embodiments, some of the coefficients may be based on a least squares optimized model of time varying amplifier non-linearity characteristics or may be derived from amplifier distortion values captured at different amplifier power levels.

In embodiments, the model may include coefficients that may be piecewise linearly interpolated from the subset of coefficients. Furthermore, the model may be configured to correct for amplifier magnitude non-linearity or phase non-linearity.

In embodiments, the model may include coefficients that are matched to levels of corresponding bins of sample coefficients.

In embodiments, the matrix of the model may be configured as a square matrix to facilitate convenient processing of mathematical operations.

In embodiments, methods and systems for digitally estimating a radio frequency amplifier non-linearity may be provided. The estimation of non-linearly may be determined using one or more time differentiated amplifier samples to form a complex matrix equation. The matrix equation may produce a subset of filter coefficients suitable for interpolation that may provide a model of the inverse of the amplifier non-linearity.

In embodiments, the amplifier samples may include input signal and output signal samples.

In embodiments, some of the coefficients may be based on a least squares optimized model of time varying amplifier non-linearity characteristics or may be derived from amplifier distortion values captured at different amplifier power levels.

In embodiments, the model may include coefficients that may be piecewise linearly interpolated from the subset of coefficients. Furthermore, the model may be configured to correct for amplifier magnitude non-linearity or phase non-linearity.

In embodiments, the model may include coefficients that are matched to levels of corresponding bins of sample coefficients.

In embodiments, the matrix of the model may be configured as a square matrix to facilitate convenient processing of mathematical operations.

In embodiments, methods and systems for linearly propagating a wireless communication signal using real-time corrective signal pre-distortion may be provided. The real-time corrective signal pre-distortion may be based on coefficients that may be linearly interpolated from a subset of coefficients. The subset of coefficients may be derived from amplifier distortion values captured at different amplifier power levels.

In embodiments, the pre-distortion may be based on a least-squares optimized model of time varying amplifier non-linearity characteristics.

In embodiments, the linear propagation may include linearly amplifying the wireless communication signal.

In embodiments, the peak to average power ratio requirement for the wireless communication signal may be greater than zero. In addition, the peak to average power ratio requirement may be greater than 10 dB.

In embodiments, the model may include coefficients that may be matched to levels of corresponding bins of sample coefficients. In addition, the coefficients may be piecewise linearly interpolated from the subset of coefficients.

In embodiments, the amplifier distortion values may represent amplifier power non-linearity or phase non-linearity.

In embodiments, methods and systems for producing a wireless standard compliant signal may be provided. The wireless standard compliant signal may be provided by digitally applying distortion correction coefficients that may be derived from amplifier distortion values. The amplifier distortion values may be captured at different amplifier power levels to produce an amplifier distortion corrected signal. The distortion correction signal may be converted into radio frequency. In addition, an amplifier may be utilized for amplifying the corrected signal.

In embodiments, applying the distortion correction coefficients may include processing an input wireless communication signal with a non-linear complex FIR filter that may contain one or more lookup tables that contain the coefficients. The complex FIR filter may implement a least squares optimized model of time varying radio frequency amplifier non-linearity characteristics. Furthermore, the distortion correction coefficients may be piecewise linearly interpolated.

In embodiments, the wireless standard compliant signal may comply with linearity requirements of one or more standards selected from a list containing WCDMA, IS-95, WiMAX 802.16d, WiMAX 802.16e, LTE, Multi-Carrier GSM, Multi-Carrier GSM-EDGE and the like.

In embodiments, the amplifier distortion values may include amplifier magnitude non-linearity or phase non-linearity.

In embodiments, methods and systems may include a pre-distorter for introducing distortion into the wireless signal for producing wireless signals compliant with wireless linearity standards. The pre-distorter may introduce distortion signal into an input signal of an amplifier based on coefficients that may be linearly interpolated from a subset of coefficients. These coefficients may be based on a least squares optimized model of time varying non-linearity characteristics derived from samples of the amplifier output for producing a wireless signal that may be compliant with one or more wireless standard linearity requirements.

In embodiments, the model may include coefficients that may be matched to levels of corresponding bins of sample coefficients.

In embodiments, the pre-distorter may include a non-linear complex FIR filter that may contain one or more lookup tables. These lookup tables may contain the coefficients. In embodiments, the coefficients may be piecewise linearly interpolated.

In embodiments, the produced wireless signal may be compliant with linearity requirements of at least one or more standards selected from a list containing WCDMA, IS-95, WiMAX 802.16d, WiMAX 802.16e, LTE, Multi-Carrier GSM and Multi-Carrier GSM-EDGE and the like.

In embodiments, the non-linearity characteristics may include amplifier magnitude non-linearity or phase non-linearity.

In embodiments, methods and systems for propagating wireless signals in a distributed wireless communication network may be provided. In accordance with the present invention, one or more linear signal amplifiers may be provided for facilitating communication among one or more wireless handsets. The one or more signal amplifiers may propagate wireless signals among the one or more wireless handsets using an amplifier pre-distortion. The amplifier pre-distortion may be based on coefficients that may be linearly interpolated from a subset of coefficients that may be based on the signal magnitude. The coefficients may be piecewise linearly interpolated.

In embodiments, the amplifier pre-distortion may correct amplifier power non-linearity or phase non-linearity.

In embodiments, methods and systems for propagating wireless signals in a distributed wireless communication network having one or more linear signal amplifiers for facilitating communication among one or more wireless handsets may be provided. In accordance with the present invention, each of the linear amplifiers may propagate wireless signals among the one or more handsets using a model of the amplifier non-linearity. The amplifier non-linearity model may be derived from a complex matrix equation formed from a plurality of magnitude differentiated amplifier samples.

In embodiments, the model of the amplifier non-linearity may include coefficients that may be matched to levels of corresponding bins of sample coefficients. In embodiments, the model of the amplifier non-linearity may include amplifier power non-linearity or phase non-linearity. In embodiments, the matrix of the model of the amplifier non-linearity may be configured as a square matrix to facilitate convenient processing of mathematical operations.

In embodiments, the complex matrix equation may produce a subset of filter coefficients that may be suitable for interpolation. Further, these coefficients may be piecewise linearly interpolated.

In embodiments, methods and systems for facilitating communication among one or more wireless handsets using one or more linear signal amplifiers may be provided. The one or more linear amplifiers may propagate wireless signals among the one or more handsets using one or more coefficients that may be calculated from a subset of coefficients. The subset of coefficients may be based on the signal magnitude. In embodiments, the coefficients may be determined using a least squares optimized model of time varying non-linearity characteristics of the amplifier.

In embodiments, the one or more linear signal amplifiers may include a non-linear complex FIR filter based on the plurality of coefficients. The non-linear complex FIR filter may pre-distort the wireless signals to correct distortion introduced by one or more of the linear signal amplifiers. Further, the coefficients may be contained in one or more lookup tables.

In embodiments, methods and systems for introducing distortion into an input signal of an amplifier may be provided. In embodiments, a pre-distorter may introduce distortion into the input signal of the amplifier based on coefficients that may be linearly interpolated from a subset of coefficients. The coefficients may be based on a least squares optimized model of time varying non-linearity characteristics derived from samples of the amplifier output.

In embodiments, methods and systems for amplifier non-linearity compensation may be provided. In embodiments, a capture facility for digitally capturing signal samples associated with an amplifier may be provided. Similarly, an estimator facility for estimating the amplifier non-linearity may be provided. The estimation may be performed by separating a portion of the digitally captured signal samples into magnitude differentiated groups to form a complex matrix equation. The matrix equation may produce a subset of coefficients that may define a distortion compensation model. In embodiments, the signal samples may include one or more input signal samples, pre-distorter output samples, and amplifier output samples.

In embodiments, a pre-distorter facility for introducing non-linearity into an input signal of the amplifier based on the distortion compensation model may be provided. In embodiments, the compensation model may include coefficients that may be matched to levels of corresponding bins of sample coefficients. In embodiments, one or more coefficients may be least squares optimized.

In embodiments, the distortion compensation model may be embodied in one or more lookup tables that may include coefficients that may be interpolated from the subset of coefficients. In embodiments, the distortion compensation model may comprise a least squares estimation of a simplified model of linearly interpolated coefficients. In other embodiments, the matrix of the model may be configured as a square matrix to facilitate convenient processing of mathematical operations.

In another aspect of the invention, methods and systems for radio frequency amplification may be provided that may include distortion adjusting a signal for radio frequency amplification by processing the signal through a pre-distortion facility that contains a plurality of lookup tables of coefficients that are calculated from a subset of coefficients that are based on the signal magnitude.

The distortion adjusted signal may be further processed with a parasitic distortion correction facility. The parasitic distortion correction facility may use distortion correction coefficients that may be derived from a complex matrix equation formed from one or more amplifier signal samples.

In embodiments, the amplifier signal samples may include parasitic distortion corrected signal samples and one or more amplifier output signals and distortion adjusted signal samples. In other embodiments, the matrix of the model may be configured as a square matrix to facilitate convenient processing of mathematical operations.

In embodiments, methods and systems for digital compensation for parasitic distortion resulting from direct baseband to RF modulation may be provided. In embodiments, a direct baseband may be processed to RF modulated signal using a parasitic distortion correction facility. The parasitic distortion correction facility may use distortion correction coefficients that may be derived from a complex matrix equation formed from one or more modulator output samples. In embodiments, the modular output samples may include real and imaginary parts. In other embodiments, the coefficients may be used for parasitic distortion correction functions. In addition, the distortion correction coefficients may be least squares optimized.

In embodiments, the distortion correction functions may include multiplying, cross-multiplying, adding, and some other types of functions. In yet other embodiment, the matrix of the model may be configured as a square matrix to facilitate convenient processing of mathematical operations.

In embodiments, methods and systems for time-alignment of two signals used for digital pre-distortion may be provided. In embodiments, a time variance between two signals captured by a capture block of an amplifier distortion adjustment facility may be calculated. The calculation may determine accuracy of alignment of the two signals.

Further, at least one of the two signals may be digitally time-shifted relative to other signal to minimize the variance. In embodiments, the digital time-shifting may include digitally time shifting interpolated versions of the two signals.

In embodiments, methods and systems for estimating a model of digital pre-distortion to compensate for amplifier non-linearity may be provided. A set of amplifier output samples may include one or more subsets of output samples. Each subset may include a subset peak value that may digitally capture a new subset of amplifier output samples when a sample includes a peak value larger than a peak value in the set. Further, each subset may use a processor to determine one subset to be replaced by the new subset and may replace the determined subset with the new subset.

In embodiments, methods and systems for incremental update of the pre-distortion model coefficient may be provided. A set of one or more amplifier distortion correction coefficients may be analyzed for determining a portion of the coefficients to be updated. Further, coefficients for the update may be generated using a complex matrix equation that may produce a subset of filter coefficients suitable for interpolation to provide a model of the inverse of amplifier non-linearity. Subsequently the portion of coefficients may be updated.

In embodiment, the determination of a portion of the coefficients to be updated may be based on a magnitude of an signal for processing through the model or a presence of coefficients suitable for distortion correcting an input signal based on a magnitude of the input signal.

In embodiments, updating the portion of coefficients may include linearly interpolating the subset of filter coefficients to produce the portion and storing the portion in a lookup table that may contain the set of amplifier distortion correction coefficients.

In embodiments, methods and systems for using a processor to generate a distortion adjustment model may be provided. The distortion adjustment model may determine a difference between a signal input to the model and a signal output from the model. The distortion adjustment model may be used by a pre-distortion facility for adjusting distortion of a radio frequency signal. The distortion adjustment model may be used by optimizing a portion of the model based on the merit of accuracy.

In embodiments, optimization may include updating a portion of one or more lookup table.

In embodiments, the processor may calculate a merit of accuracy of a candidate distortion adjustment model and updating the distortion adjustment model.

In embodiments, the distortion adjustment model may be updated based on a comparison of the merit of accuracy of the candidate distortion adjustment model with the merit of accuracy of the distortion adjustment model. The updating may occur if the comparison indicates improved pre-distortion facility accuracy if the update occurs.

In embodiments, the model may be based on a piecewise linear interpolation of the representative coefficients, fixed interpolation of the representative coefficients or some other type of interpolation techniques. The model may be updated based on a subset of captured samples of the amplifier output. The samples of the amplifier output may be captured based on an assessment of an input signal. Further, the model may be updated based on a subset of captured samples of the pre-distorter output. The samples of the pre-distorter output may be captured based on an assessment of an input signal.

In embodiments, a non-linear digital pre-distortion facility may be based on dynamically adjusted lookup tables.

In embodiments, the adjusted signal may be generated by a digital pre-distortion facility. The digital pre-distortion facility may introduce non-linear characteristics into an input signal of the amplifier. In addition, the digital pre-distortion facility may include a FIR filter or a least-squares optimization of a model of the amplifier distortion characteristics.

In embodiments, the amplifier distortion correction may be based on aspects of the linearity performance of the amplifier. The amplifier distortion correction may be a signal representing the amplifier distortion. Further, the amplifier distortion correction may be by offsetting gain non-linearity or offsetting phase non-linearity.

In embodiments, system and methods of the present invention may include a pre distortion block containing non-linear complex FIR filter structure. The FIR structure may include one or more delay taps. The filter coefficients of these delay taps may be dependent on the magnitude or power of the input samples with the objective of applying a non-linear model of the inverse power amplifier response.

In embodiments, the delay terms of the pre distortion block may be non-uniform, or may remain unused by populating with zero coefficients when they are not required. This may facilitate tailoring the pre-distortion response to a wide variety of power amplifier characteristics.

In embodiments, a capture block for capturing two simultaneous sets of real or complex samples for analysis based on a trigger may be provided. The trigger may be formed, when sample magnitude exceeds a programmable threshold.

In embodiments, an estimator block may be provided. The estimator block may modify and analyze the samples from the capture block by placing them into one or more estimation bands based on the magnitude or power of that sample. The estimator block may populate one or more multi-dimensional array structures with accumulations of these structures to form a complex matrix equation. The matrix equation may yield complex multiplying coefficients when solved using conventional methods. The multiplying coefficients may be interpolated to generate the coefficients used in the pre-distorter block.

In embodiments, the estimator block may calculate an estimate of the amplifier response. The estimate may be calculated by placing the samples from signals taken before and after the amplifier into estimation bands based on their magnitude or power. These samples may be accumulated into locations in array structures based on their band number to form a vector equation. The vector equation may be solved by conventional methods to calculate a complex multiplying coefficient for each band which can be applied to all samples which would fall into the power band with the intention of creating the opposite gain and phase change that the sample will experience in the amplifier.

In embodiments, a system for digitally compensating for the parasitic distortion effects in a transmitter design may be provided. The parasitic distortion effects may be introduced by the use of direct baseband to RF modulator in a transmitter design. The system may include a QMC block, a capture block, and an estimator block. The QMC block may contain multiplier, cross-multiplier and adder functions. These functions may operate on real and imaginary parts of the transmit signal to compensate for distortion introduced by a direct baseband to RF modulator. The capture block may be capable of capturing two simultaneous sets of real or complex samples for analysis based on a trigger. The trigger may be formed, when a sample magnitude may exceed a programmable threshold.

In embodiments, a method to use the estimation method detailed in 6 may be provided. The method may include a reduced number of estimation bands to minimize the memory requirements when implemented in a processor system by interpolating the discrete calculated coefficients for each estimation band over a linear range of magnitude or power values.

Embodiments may include an estimator as set out herein. In the estimator, both the sample being analyzed and previous sample values may be placed into estimation bands based on their magnitude or power, and then accumulated in multi-dimensional array structures based on their band number to form a matrix equation. The matrix equation may be solved to give complex multiplying coefficients for the samples and previous sample values which would fall into each band based on their magnitude or power.

In embodiments, an autonomous control loop may be provided. The control loop may control the updating of the models when necessary.

The estimator block may modify and analyze the samples from the capture block by separating the real and imaginary parts and accumulating them into one or more multidimensional array structures to form a complex matrix equation. The matrix equation may yield real values for the multiplying, cross-multiplying and additive coefficients used in the QMC block when solved by conventional methods.

In embodiments, a method of calculating the necessary time shift to align two signals for use in a digital pre-distortion system may be provided. The accuracy of alignment may be measured by calculating the variance between the two signals and shifting the signals or interpolated versions of the signals relative to each other until a minimum value is found.

Embodiments may include an estimator as set out above. In the estimator, the samples may not be placed into a single estimation band based on their magnitude or power, but may be distributed over two adjacent estimation bands by multiplication by a value proportional to their magnitude or power relative to the magnitude or power values which form the bounds of each band, with the objective of improving the accuracy when the distribution of samples in a band is skewed to either the upper or lower magnitude or power bound.

In embodiments, an autonomous control loop may be provided. The control loop may control the updating of the models when necessary.

In embodiments, a method for capturing a number of subsets of samples in the buffer may be provided. Each set may contain a sample peak larger than the last sample. This may increase the density of larger magnitude samples that may be used for estimation of a digital pre-distortion system.

In embodiments, averaging of newly calculated coefficients with existing coefficients may be provided. This method may increase the overall averaging of the system and increase the accuracy of the model.

In embodiments, an autonomous control loop may be provided. The control loop may control the updating of the models when necessary.

In embodiments, a method of updating only a selected set of coefficients in the model may be provided. The coefficient may include those for which the existing model has inaccurate or non-existent values. This method may improve the accuracy or range of the model.

In embodiments, a method of calibrating the required gain in the RF receiver path may be provided. The calibration may include comparing the power in the transmit signal to the DAC and the feedback signal from the ADC and adjusting the gain such that there may be a fixed gain relationship between these points. The method may preserve good signal quality for the feedback signal.

In embodiments, a method of monitoring the gain in the RF feedback path may be provided. The gain may indicate changes in ambient temperature that may affect the amplifier or modulator response and necessitate that the system updates the models.

In embodiments, a method of calculating the error between the transmit signal and the feedback signal when passed through the calculated model may be provided. A figure of merit may be generated for the accuracy of the model, which can be used to indicate when the models may need to be updated.

In embodiments, a method of storing the maximum magnitude or power of the transmit signal may be provided. The method may immediately make apparent when the signal exceeds the range of values over which the model is valid. The method may be used to indicate when the model may need to be extended or updated.

In embodiments, an autonomous control loop may be provided. The control loop may control the updating of the models when necessary.

BRIEF DESCRIPTION OF THE DRAWINGS

The invention and the following detailed description of certain embodiments thereof may be understood by reference to the following figures.

DESCRIPTION OF THE PREFERRED EMBODIMENTS

Figure 1:
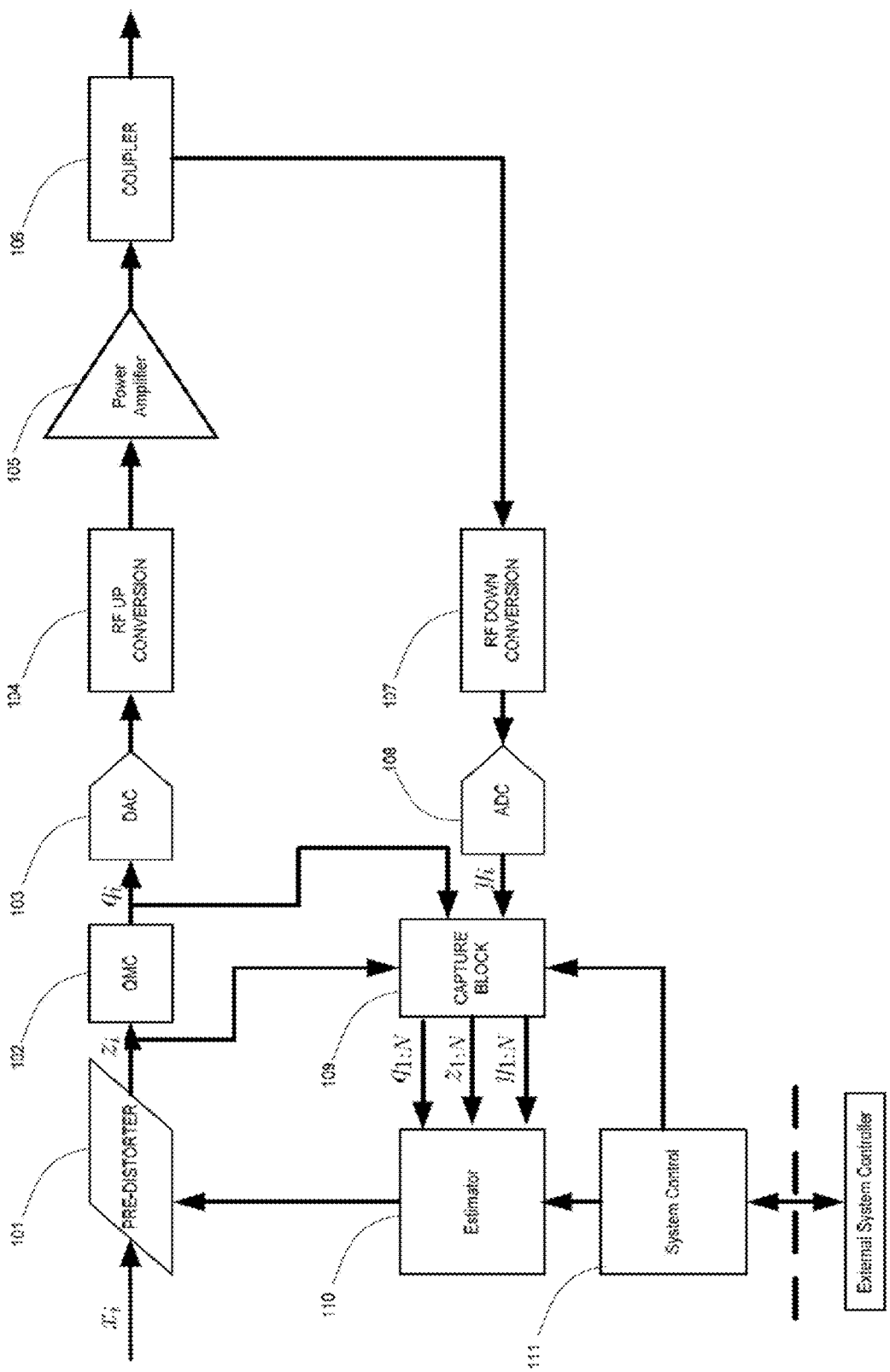
FIG. 1 depicts a block diagram of an embodiment of the invention.

Referring to FIG. 1, which depicts a block diagram of an embodiment of the invention, a pre-distorter 101 may receive distortion adjustment data from an estimator 110 that may estimate distortion correction based on data captured by a capture block 109. In addition, the invention may be controlled, such as through system control 111. The capture block 109 may capture data from the pre-distorter 101 output, a QMC block 102 output, and/or a power amplifier 105 output through a feedback coupler 106 which feeds an RF down converter 107 which feeds a feedback ADC 108. The pre-distorter 101 may output a distortion compensated signal to the QMC block 102 which may in turn feed an output digital to analog converter 103 that may output an analog version of the propagated signal to an RF up conversion facility 104 that may in turn feed the power amplifier 105.

Pre-Distorter Block

Figure 2:
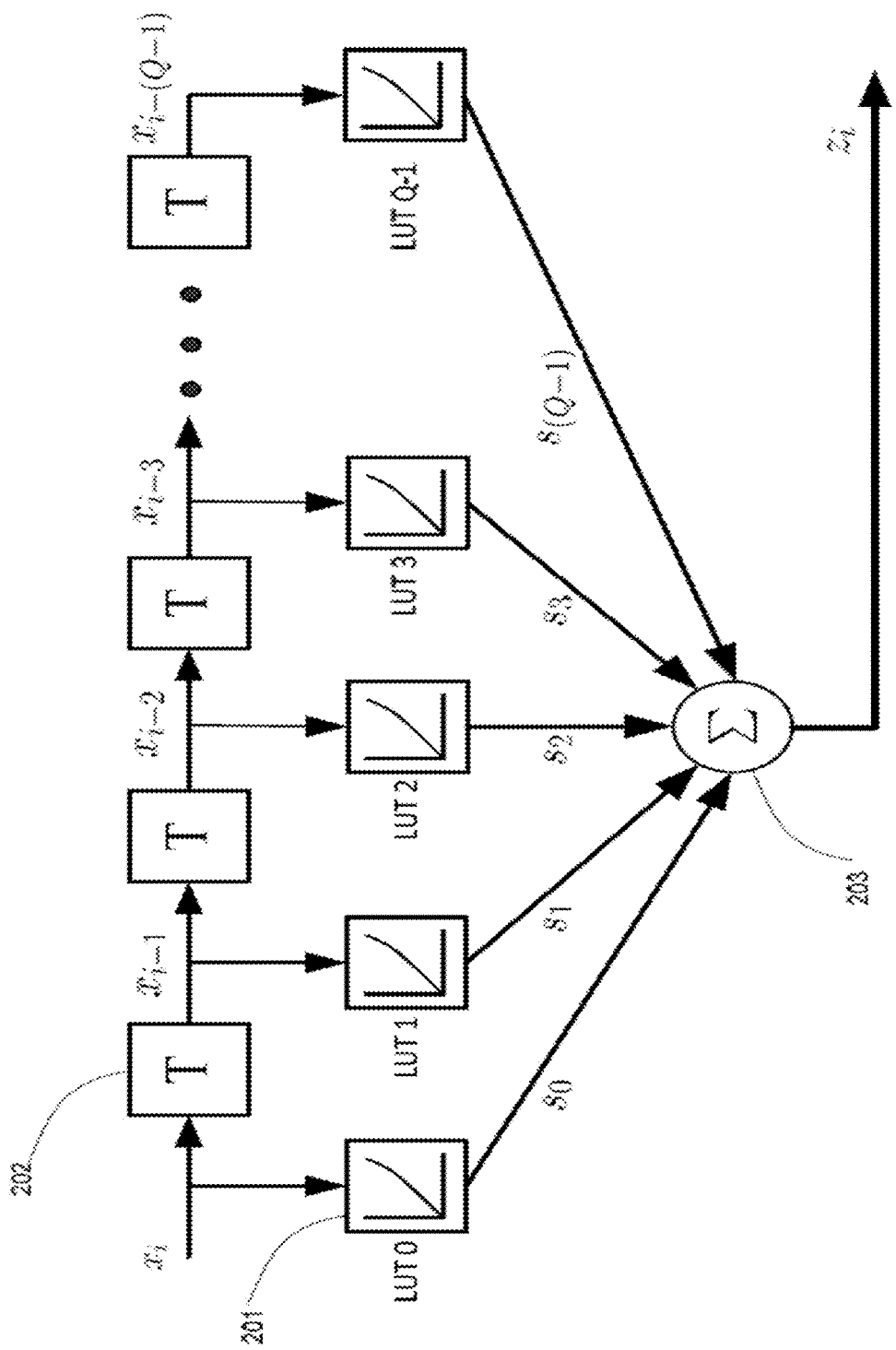
FIG. 2 depicts a block diagram of an embodiment of a pre-distorter facility.

Referring to FIGS. 1 and 2 a pre-distorter block 101 applies a non-linear function to achieve a goal of cancelling the distortion introduced by an RF power amplifier 105. A portion of the details of an embodiment of the pre-distorter block are further illustrated in FIG. 2.

The pre-distorter 101 exemplary details shown in FIG. 2 include a plurality of delay blocks 202 that each capture a time-delay replica of the input signal, a plurality of unique look-up tables 201 that are connected to the input signal and to the output of each delay block 202, and a summing point 203 that performs a function, such as a summation, of the outputs of each look-up table.

Figure 3:
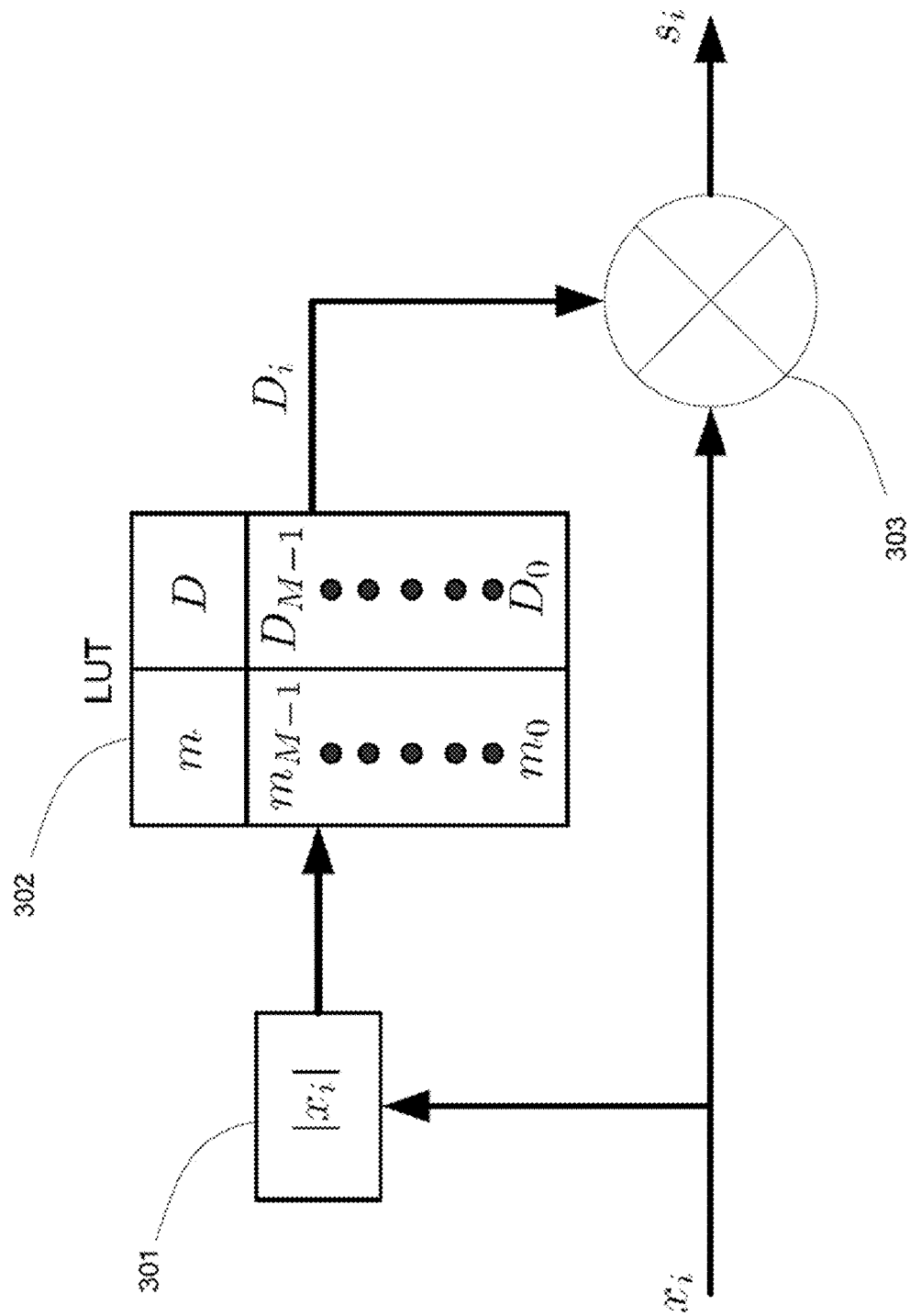
FIG. 3 depicts a look-up-table embodiment of the invention.

The sampled digital input signal $x_i$ is applied to the series of delay blocks 202 which have a delay T, which may be an arbitrary number of samples, but for clarity in the following analysis T will be assumed to be a 1 sample delay. In addition, a value of T may be different for each individual delay block 202. A total of Q−1 delayed replicas of the input signal are created where Q is referred to as the memory depth of the pre-distorter 101. A typical embodiment would require a Q value in the range from two to four. The input signal $x_i$ and the delayed replicas $x_{i-1}$, $x_{i-2}$, $x_{i-3}$ etc. are each applied to a LUT entity 201. The LUT entity 201 applies a complex gain scaling dependent upon the magnitude of the input into the LUT entity. More specifically the LUT entity applies complex gain scaling according to which one of M discrete magnitude bands that the input signal falls within. FIG. 3 illustrates an embodiment of the LUT entity 201.

In order to define mathematically the LUT entity and to aid the latter description of the digital pre-distortion (DPD) estimation algorithm we define the following general function:

$$\beta(w)_{i,b} = \begin{cases} 1 & \text{if } w_i \text{ such that } M_b \le |w_i| < M_{b+1} \\ 0 & \text{otherwise} \end{cases} \quad (1)$$

In other words if $W_i$, is in magnitude band b the function returns 1 and otherwise returns 0. This is similar to a Kronecker Delta used to pluck values from a matrix equation i.e.

$$x_i = \sum_j \delta_{i,j} x_j \quad (2)$$

The behaviour of the LUT entity can be described as follows where $r_i$ is the complex input to the LUT entity and $s_i$ is the output:

$$s_i \to \begin{cases} D_0 r_i & \text{if } r_i \text{ in magnitude band 0} \\ D_1 r_i & \text{if } r_i \text{ in magnitude band 1} \\ D_2 r_i & \text{if } r_i \text{ in magntidude band 2 etc.} \end{cases} \quad (3)$$

where $D_0, D_1, D_2$ etc are complex coefficients. In a typical embodiment there will be 256 magnitude bands where $m_0$ is the threshold for the lowest magnitude band and $m_{M-1}$ the threshold for the highest magnitude band.

The operation of the LUT entity can be described by the following equation making use of the function β previously defined:

$$s_i = \sum_{m=0}^{M-1} D_m \beta_{i,m} r_i \quad (4)$$

Using the definition of the LUT entity given by equation (4) the operation of the pre-distorter block can be described as follows where q is the index of the delay term $$z_i = \sum_{q=0}^{Q-1} \sum_{m=0}^{M-1} D_{m,q} \beta_{i-q,m} x_{i-q} \quad (5)$$

The LUT entity provides a means to provide an arbitrary complex nonlinear function in a manor which allows for straightforward implementation, such as implementation in an FPGA. Practical experimentation has shown the noise floor of the transmitter output is dependent upon the number of magnitude bands M. An implementation with 256 magnitude bands has been shown to have acceptable noise performance to satisfy typical wireless communications standards.

In a typical embodiment the pre-distorter block will be implemented as a real time entity within an FPGA. For example in a typical WCDMA or LTE application the input signal $x_i$ and the output signal $z_i$ would both be sampled at 122.88MSPS.

The structure detailed in FIG. 2 has the potential to provide a time variant non-linear function as is required to pre-distort a power amplifier including memory effects and the structure lends itself to efficient logic implementation, such as an FPGA implementation.

Figure 4:
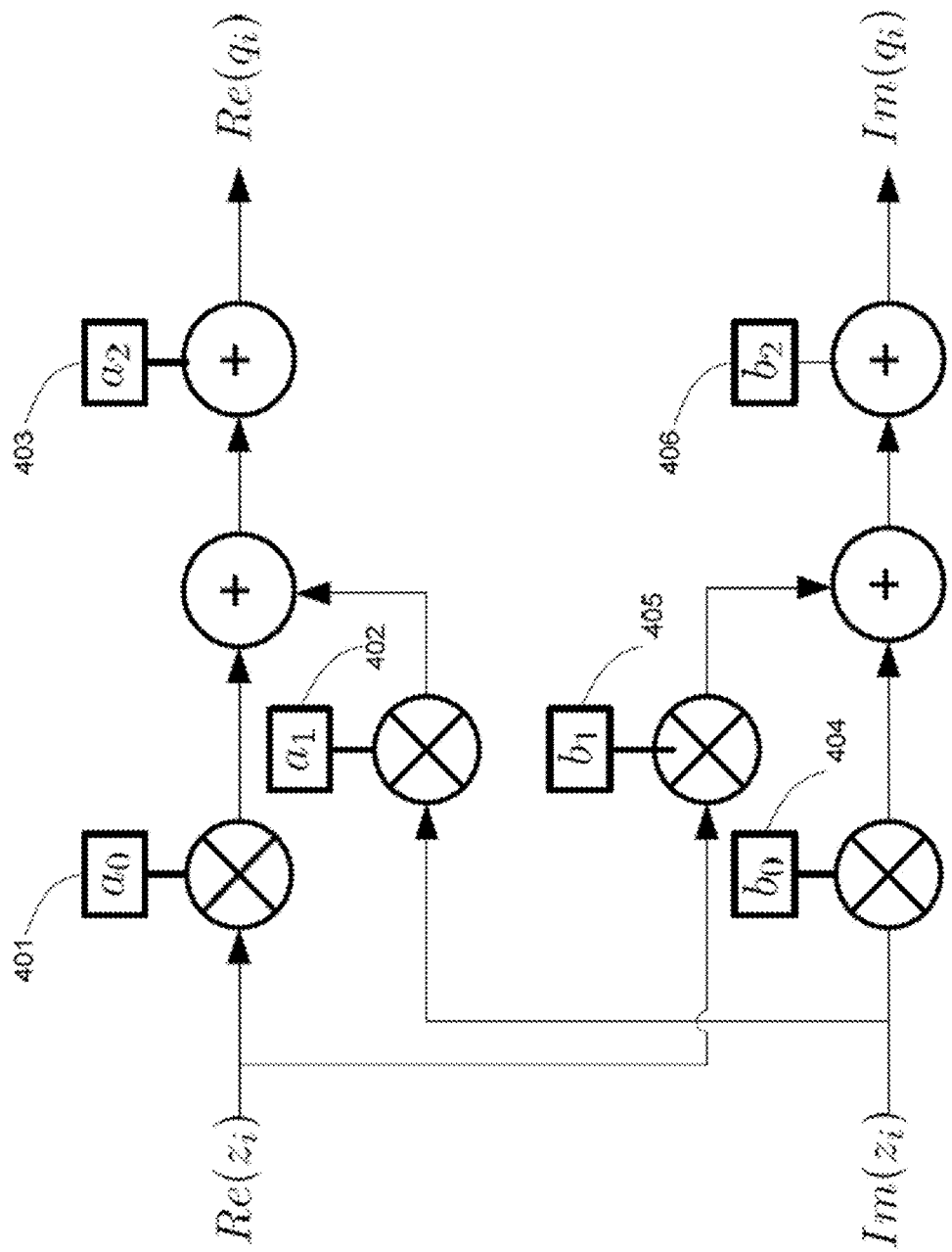
FIG. 4 depicts a block diagram of an up-conversion distortion compensation facility.

In addition, the structure stores the maximum calculated magnitude index in a register which can be read or reset at any time by the update control process. This can be used to indicate the dynamic range of signal $x_i$ which is important for setting a trigger level when the system is capturing samples.
QMC The output of the pre-distorter block $z_i$ is passed to a QMC block 102 which outputs the signal $q_i$. The QMC block corrects for the errors introduced if a direct complex to RF up-conversion is utilised within 104. It is well understood that practical complex to RF up-conversion suffer from a number of imperfections which include LO-RF leakage, I and Q gain imbalance and imperfect phase offset between the I and Q LO signals. If the RF signal is considered in complex envelope representation i.e. as a phasor at the fundamental RF frequency multiplied by a base-band complex waveform, then LO-RF leakage is equivalent to a complex dc offset, I and Q gain imbalance is equivalent to gain delta between the real and imaginary paths and imperfect quadrature balance is equivalent to cross talk between the real and imaging data. The structure illustrated by FIG. 4 is well understood to be able to provide a compensating effect for the errors introduced in the direct conversion up-converter by providing equal but opposite imperfections to those in the direct modulator thereby cancelling out the imperfections of the modulator. The function of the QMC block can be described by the following equations:

$$Re(q_i) = (a_0 Re(z_i) + a_1 Im(z_i) + a_2) \quad (6)$$

$$Im(q_i) = (b_0 Im(z_i) + b_1 Re(z_i) + b_2) \quad (7)$$

where the coefficients $a_0, a_1, a_2, b_0, b_1, b_2$ are provided by the estimator block 110 in order to compensate for the characteristics of the direct RF up-converter. As per the pre-distorter block 101 the QMC block in a typical embodiment will be implemented within an FPGA and will operate in a real time manor at the same sampling rate as the pre-distorter block 101.

RF Signal Processing

The output of the QMC block $q_i$ is processed by a digital to analogue converter 103. If the RF up-converter 104 uses a direct to RF approach a complex digital to analogue converter will be required. The analogue signal from the DAC 103 is converted to RF by the RF up-conversion block 104. The RF-up conversion block may use an IF based architecture or a direct architecture. If an IF based architecture is used a mixing process will be required in the digital transmit chain immediately prior to the transmit DAC 103 in order to convert the complex base-band signal to a real IF signal at an appropriate frequency prior to digital to analogue conversion. The pre-distorter block 101 when operating on the input signal $x_i$ applies a non-linear function which will adds distortion to $x_i$, the additional distortion occupies a spectral bandwidth wider than the original transmit signal $x_i$. Therefore the RF Up-Conversion block 104 can be optimised to ensure it can process the wider signal bandwidth associated with $z_i$ as opposed to the input signal $x_i$ with acceptable impairments in terms of phase and amplitude linearity across the bandwidth of $z_i$.

The output of the RF up-conversion block 104 is passed to the RF power amplifier. A portion of the power amplifier RF output is coupled using the coupler block 106 to provide a feedback signal to allow optimization of the pre-distortion and QMC systems. The RF feedback signal is processed by the RF down-conversion block 107 in order to convert the RF feedback signal either to a complex base-band representation or suitably low IF frequency to allow direct digital sampling. In a similar manor to the RF up-converter block 104 the RF down-converter shall support sufficient bandwidth to allow accurate capturing of the power amplifier distortion. The output of the RF Down-conversion block 107 is processed by an ADC 108 in order to create the digitized feedback signal $y_i$.

Capture Block

Figure 5:
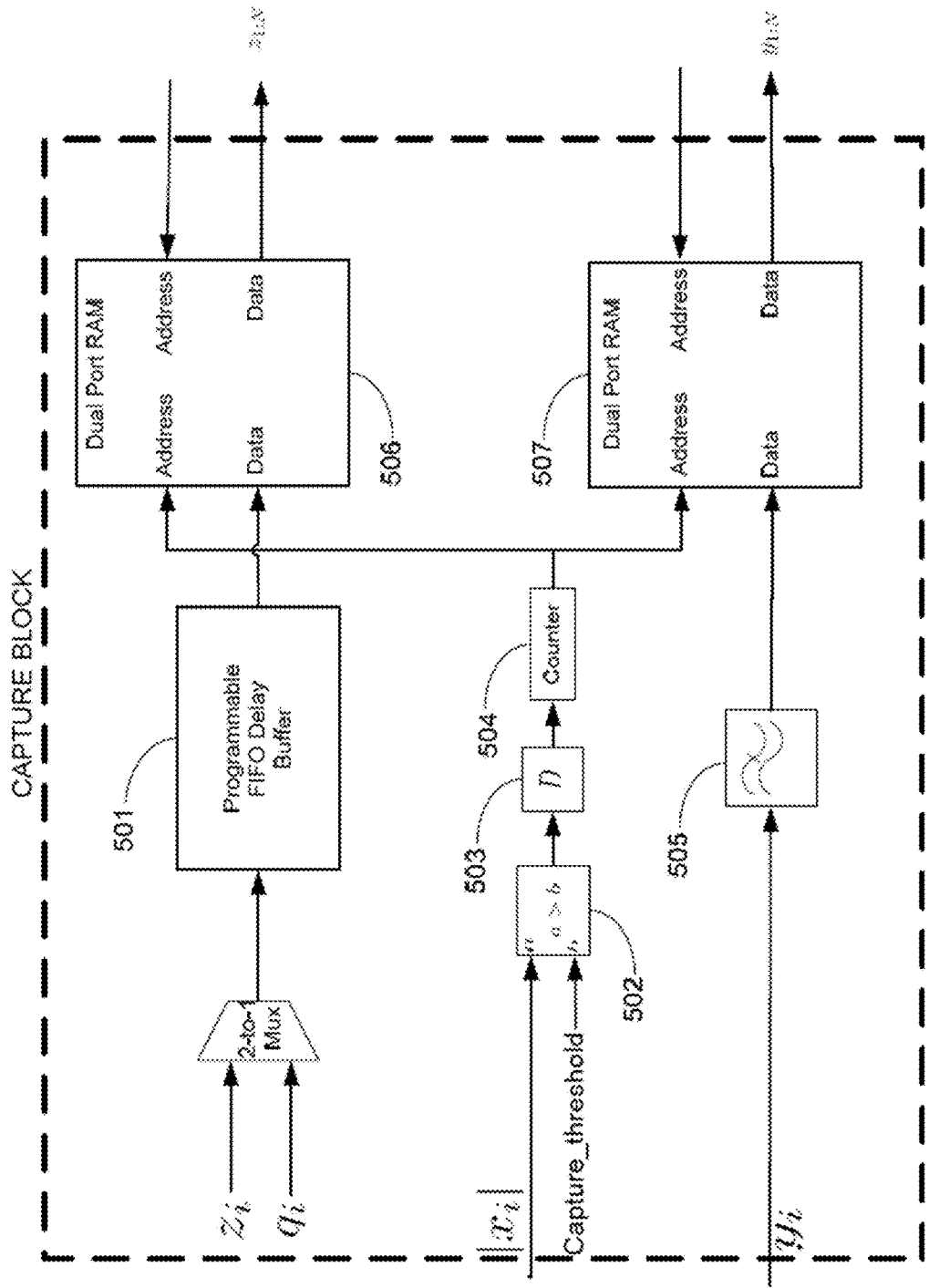
FIG. 5 depicts a block diagram of a capture facility.

The capture block 109 is illustrated in FIG. 5. It operates on two signals, the first signal is either the output from the pre-distorter block $z_i$ or the output from the QMC block $q_i$, the second signal is always the feedback signal $y_i$ defined as the signal immediately following the feedback receiver ADC 108. The function of the capture block is to store a set of samples of $z_i$ or $q_i$ and a corresponding set of feedback samples $y_i$ when triggered, where the trigger is generated by comparing the modulus of $x_i$ against a threshold capture_threshold provided by the estimator block. The modules of $x_i$ is already calculated in real time in the pre-distorter block by 301. Note that in an example deployment, such as an FPGA embodiment, the modulus of $x_i$ will be calculated by a CORDIC implementation with an appropriate number of iterations.

In order to coarsely account for the time delay between the signals $z_i$ or $q_i$ and signal $y_i$, the signals $z_i$ or $q_i$ are passed though a FIFO structure with a programmable delay D 501 prior to being applied to the dual-port RAM 506, where D is selected to approximately compensate for the delay in the path from the input to 102 to the feedback ADC 108 output. If the modulus of $x_i$ is greater than capture_threshold then the comparator 502 will generate a logic 1, which we refer to as a trigger. The trigger is passed to a delay block 503 which delays the signal by D−32 samples, ensuring that the sample which generates the trigger will appear within the samples that are captured, approximately 32−p samples form the start, where P is a processing delay due to the time taken for the samples to propagate from point $x_i$ to point $z_i$ or $q_i$. The number 32 is chosen to ensure that the peak which caused the trigger event will appear in the capture, and assumes P takes a value of less than 16. In practice the number should be chosen to ensure that when P is subtracted the remainder falls within and near the start of the captured samples.

A high output from 503 starts a counter 504 which increments the address field of the dual-port RAMs 506 and 507 so that the delayed samples of signals $z_i$ or $q_i$ are written sequentially into the dual-port RAM 506 and the samples of signal $y_i$ are written sequentially into the dual-port RAM 507 after $y_i$ is filtered by a moving average filter 505 optimised to remove any DC term on the signal $y_i$. In a typical embodiment the dual-port RAM 506 associated with $z_i$ or $q_i$ shall store 1K complex samples, the dual-port RAM 507 stores 2 k real samples assuming $y_i$ is in real format and sampled at twice the sampling rate of $x_i$. The contents of the dual-port RAM 506 following successful trigger is a consecutive series of samples of $z_i$ or $q_i$ named $z_{1:N}$ or $q_{1:N}$ where N is the total number of samples, i.e. the depth of the dual-port RAM 506. The contents of the dual-port RAM 507 following successful trigger is a consecutive series of samples of $y_i$ named $y_{1:2N}$ where 2N is the total number of samples, i.e. the depth of the dual-port RAM 507. The estimator block may access both dual-port RAM's 506 and 507 in order to read $z_{1:N}$ or $q_{1:N}$ and $y_{1:2N}$.

In general with any digital pre-distortion technique it is desirable to optimize the pre-distorter using a data set which contains samples distributed across the full dynamic range of the PA. In addition it is desirable that the data set contains sufficient samples in each region of the PA characteristic to provide an averaging effect to overcome noise on the feedback signal $y_i$. However a typical CDMA or OFDM signal used in wireless communication standards has a Gaussian distribution of instantaneous power per sample, i.e. the very highest power samples and lowest power samples occur infrequently, most samples are located near the average value. In terms of pre-distortion performance it is particularly desirable to implement a technique to ensure a dataset can be captured which include sufficient high power samples. It has been experimentally shown that simply capturing a 1K set of continuous samples is unlikely to provide sufficient high power samples. The simplest and common approach to solve this issue is simply to capture a much larger set of continuous samples such as 64K set of continuous samples. However this places a requirement to support a large memory which is undesirable for resource limited deployments, such as an FPGA implementation. In order to resolve this issue an enhancement to the system is provided for the case when the estimator wants a higher concentration of samples with large magnitudes to populate the upper estimation bands. In this case the 1K capture is split into 8 sets of data each 128 samples in length. The first set will be populated when capture_threshold is exceeded, and the maximum magnitude in this data is then set as capture_threshold for the next capture. This continues for all 8 sets, at which point the buffers will contain 8 sets of data, each containing sample peaks of increasing magnitude. If all 8 sets are not populated the capture process can be stopped and the number of available sets is reported to the estimator allowing it to process the samples from these sets.

Estimator Block

Figure 6:
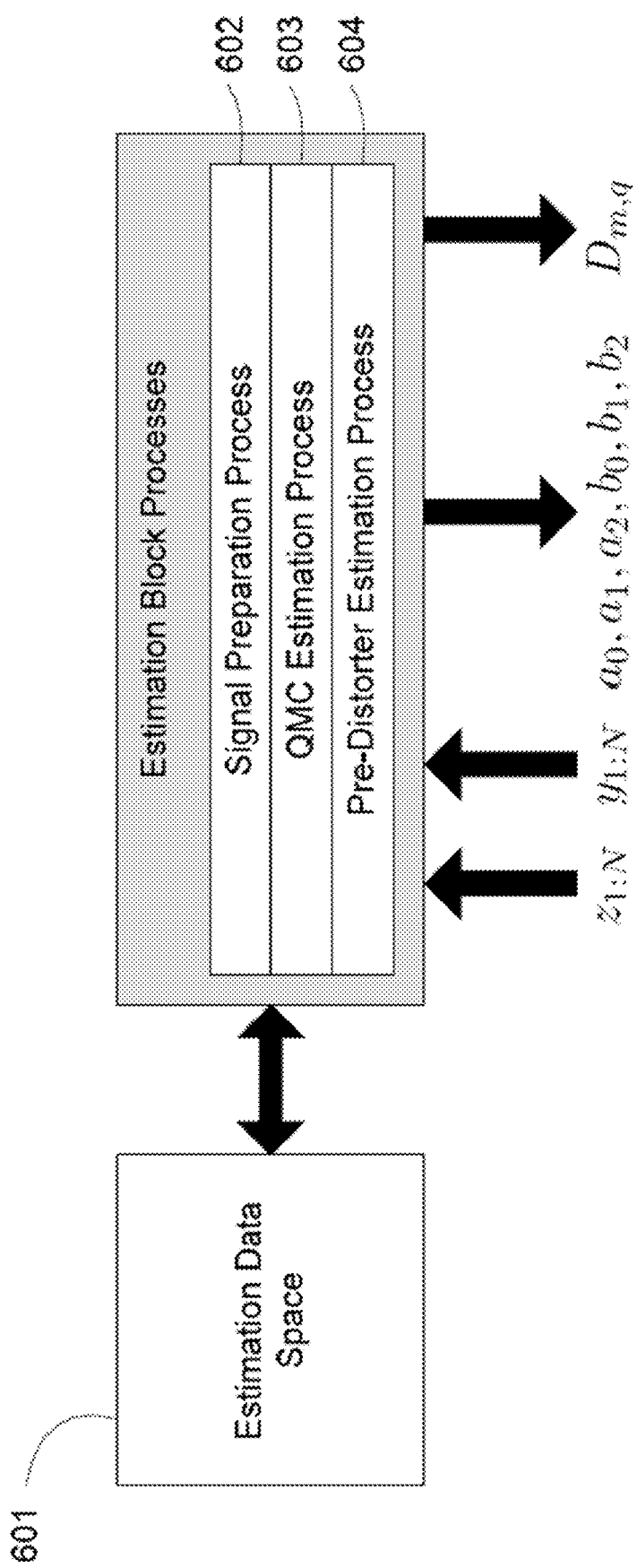
FIG. 6 depicts an estimation facility.

Referring to FIG. 6, the estimator block 110 may include a number of processes which take the captured samples $z_{1:N}$ or $q_{1:N}$ and $y_{1:2N}$ as an input and generates the coefficients for the pre-distorter ($D_{m,q}$) and QMC ($a_0$, $a_1$, $a_2$, $b_0$, $b_1$, $b_2$) blocks. This section may be implemented by an FPGA embedded microprocessor, and may be supplemented by hardware blocks to perform specific functions as required dependent upon the update speed requirements. The different processes are called sequentially and share the same microprocessor data space 601 which is used for storing the vectors and matrices which are used in the estimation calculations. The estimator block performs three functions which are signal preparation 602, QMC estimation 603 and pre-distorter estimation 604 each described in the following sections.

Signal Preparation 602

Prior to the captured signals being used for coefficient estimation the z and y signals should be in the form of baseband complex samples, at the same sampling rate, the same average magnitude and be aligned in both time and phase. Optionally the average magnitudes may be different to remove the need to scale the signals and speed up this process, in which case the necessary normalisation can be applied to the calculated complex coefficients $D_{b,q}$. To achieve this end the y signal may need to be converted to baseband complex samples if a real IF receiver is used by multiplying the real signal by a complex sinusoid of appropriate frequency and the signal can be resampled to match the sample rate of the z signal.

The signals will usually be offset in time relative to each other and this can be removed by shifting one of the signals in time. Shifting by an integer number of samples will normally give insufficient alignment accuracy so the signals may be interpolated to a sample rate which gives the required accuracy prior to the shift, and then decimated back to the original sampling rate afterwards. Rather than use a cross-correlation method such as is detailed in U.S. Pat. No. 6,798,843 to calculate the delay offset, the system uses a simpler method that calculates the variance between the two signals at each offset to determine if they are aligned. This entails firstly shifting one signal relative to the other by whole samples to find the coarse delay figure, denoted by having the lowest variance figure. Then the signals are interpolated to the achieve the required accuracy and the process is repeated with the new signals, but it is only necessary to shift for a limited number of samples around the existing coarse delay value to find the fine delay value, again denoted by the minimum variance figure. In most systems this delay varies slowly and so this calculation need only be performed infrequently and the coarse and fine offsets stored for application to the captured sample sets, saving time in the capture process. When a sample capture is performed the coarse offset can be applied by a simple shift operation and the fine offset applied by passing the signal through a FIR filter structure, which will have a different set of coefficients for each of the possible fine offset values.

Multiplying each complex sample in the z signal by the conjugate of its equivalent sample in the y signal, and averaging this value across the samples in the capture gives a complex vector containing the gain and phase difference between the two signals. This is normalised to a unit vector and multiplies every sample in the z signal to phase align it with the y signal.

QMC Estimation 603

In the case where the transmitter uses a direct RF modulator architecture the QMC estimation can be included to compensate for the unwanted effects of the RF modulator. The effects are primarily the introduction of DC offsets to I or Q, linear scaling of I or Q, and phase changes in I or Q. These modes of distortion are compensated directly by calculating and applying the coefficients a and b to the transmit signal.

$$Re(q) = (a_0 Re(x) + a_1 Im(x) + a_2) \quad (8)$$

$$Im(q) = (b_0 Im(x) + b_1 Re(x) + b_2) \quad (9)$$

If the QMC is to correct the modulator distortion then we need to find estimated values for signal q such that signal y=x, therefore we can rewrite the equations as:

$$Re(q^{est}) = (a_0 Re(y) + a_1 Im(y) + a_2) \quad (10)$$

$$Im(q^{est}) = (b_0 Im(y) + b_1 Re(y) + b_2) \quad (11)$$

We solve this equation using a least squares approach, based on a captured set of N samples:

$$Err = \sum_{i=0}^{N-1} |q_i - q_i^{est}|^2 \quad (12)$$

Giving:

$$Err = \sum_{i=0}^{N-1} \left\{ \begin{array}{l} \{a_0 Re(y_i) + a_1 Im(y_i) + a_2 - Re(q_i)\}^2 + \\ \{b_0 Im(y_i) + b_1 Re(y_i) + b_2 - Im(q_i)\}^2 \end{array} \right\} \quad (13)$$

The value for each of the a and b coefficients which minimizes the error can be found by setting the partial differential to zero for each coefficient, giving six equations:

$$\frac{\partial Err}{\partial a_0} = 0 \text{ gives:} \quad (14)$$

$$0 = \sum_{i=0}^{N-1} \{a_0 Re(y_i) + a_1 Im(y_i) + a_2 - Re(q_i)\} Re(y_i)$$

$$\frac{\partial Err}{\partial a_1} = 0 \text{ gives:} \quad (15)$$

$$0 = \sum_{i=0}^{N-1} \{a_0 Re(y_i) + a_1 Im(y_i) + a_2 - Re(q_i)\} Im(y_i)$$

$$\frac{\partial Err}{\partial a_2} = 0 \text{ gives:} \quad (16)$$

$$0 = \sum_{i=0}^{N-1} \{a_0 Re(y_i) + a_1 Im(y_i) + a_2 - Re(q_i)\}$$

$$\frac{\partial Err}{\partial b_0} = 0 \text{ gives:} \quad (17)$$

$$0 = \sum_{i=0}^{N-1} \{b_0 Re(y_i) + b_1 Im(y_i) + b_2 - Re(q_i)\} Re(y_i)$$

$$\frac{\partial Err}{\partial b_1} = 0 \text{ gives:} \quad (18)$$

$$0 = \sum_{i=0}^{N-1} \{b_0 Re(y_i) + b_1 Im(y_i) + b_2 - Re(q_i)\} Im(y_i)$$

$$\frac{\partial Err}{\partial b_2} = 0 \text{ gives:} \quad (19)$$

$$0 = \sum_{i=0}^{N-1} \{b_0 Re(y_i) + b_1 Im(y_i) + b_2 - Re(q_i)\}$$

This set of simultaneous equations can now be solved to find the values of the a and b coefficients by conventional means. One approach is to create a matrix C, and writing $$R_i = Re(y_i) \text{ and } I_i = Im(y_i):$$

$$C = \begin{pmatrix} \Sigma R_i^2 & \Sigma R_i I_i & \Sigma R_i \\ \Sigma R_i I_i & \Sigma I_i^2 & \Sigma I_i \\ \Sigma R_i & \Sigma I_i & N \end{pmatrix} \quad (20)$$

Giving:

$$C \begin{pmatrix} a_0 \\ a_1 \\ a_2 \end{pmatrix} = \begin{pmatrix} \sum R_i Re(q_i) \\ \sum I_i Re(q_i) \\ \sum Re(q_i) \end{pmatrix} \quad (21)$$

and:

$$C \begin{pmatrix} b_0 \\ b_1 \\ b_2 \end{pmatrix} = \begin{pmatrix} \sum R_i Im(q_i) \\ \sum I_i Im(q_i) \\ \sum Im(q_i) \end{pmatrix} \quad (22)$$

Combining these equations to create a complex equation, and defining complex coefficients $C_k = a_k + jb_k$:

$$\begin{pmatrix} \Sigma R_i^2 & \Sigma R_i I_i & \Sigma R_i \\ \Sigma R_i I_i & \Sigma I_i^2 & \Sigma I_i \\ \Sigma R_i & \Sigma I_i & N \end{pmatrix} \begin{pmatrix} c_0 \\ c_1 \\ c_2 \end{pmatrix} = \begin{pmatrix} \Sigma R_i q_i \\ \Sigma I_i q_i \\ \Sigma q_i \end{pmatrix} \quad (23)$$

This can be solved using conventional methods such as Gaussian elimination with pivoting.

DPD Estimation 604

The estimator block is required to create an accurate inverse model of the PA behaviour. Other approaches such as those mentioned in U.S. Pat. Nos. 6,903,604 and 6,798,843 require large amounts of memory, which makes them unsuitable for many low cost or limited resource implementations, such as a small FPGA-based implementation where memory resources are limited.

Figure 7:
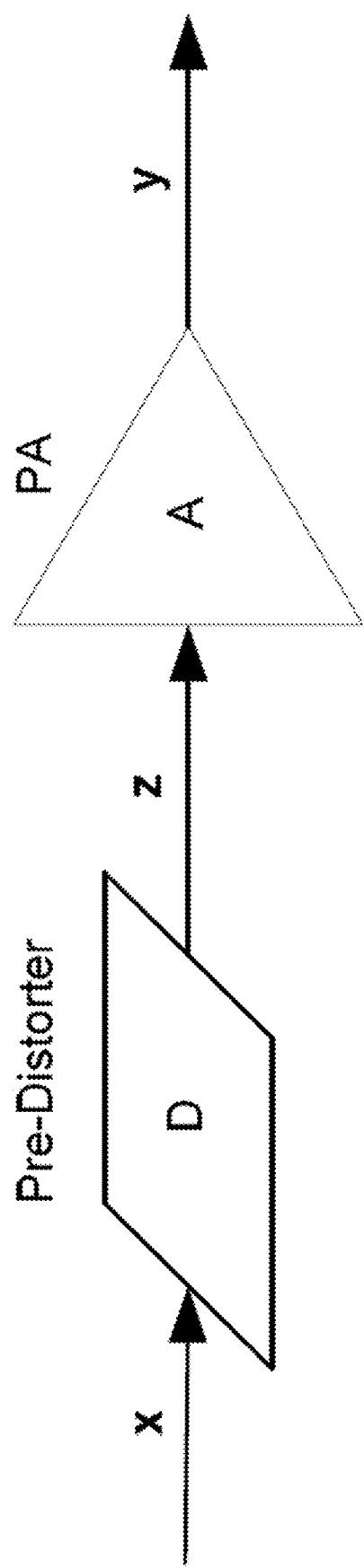
FIG. 7 depicts a block diagram of a simplified embodiment of the invention.

In order to describe the DPD estimation process the simplified block diagram detailed in FIG. 7 will be referenced. Using the terminology previously defined x is the original input signal, z is the output of the pre-distorter block, and y is the output of the power amplifier, in each case they are assumed to be vectors consisting of a series of continuous samples. For simplicity it is assumed in the following analysis that x, z and y are aligned in time and phase as detailed in Signal Preparation 602.

If a pre-distorter function is defined as D and the PA function as A then in vector notation we can define the following:

$$z = D(x) \quad (24)$$

$$y = A(z) \quad (25)$$

The goal of DPD estimation is to optimise the function D such that for some real gain G:

$$y = Gx \quad (26)$$

From equation 24 and 25 we can write:

$$y = A(D(x)) \quad (27)$$

The aim is to satisfy equation 26, i.e.:

$$Gx = A(D(x)) \quad (28)$$

Which is equivalent to:

$$D(x) = A^{-1}(Gx) \quad (29)$$

Now we have from definition 25 that:

$$z = A^{-1}(y) \quad (30)$$

From equation 29 the pre-distorter function D must have the same functional form as $A^{-1}$. The pre-distorter function D has been previously defined by equation (5) repeated below for clarity:

$$z_i = \sum_{q=0}^{Q-1} \sum_{m=0}^{M-1} D_{m,q} \beta_{i-q,m} x_{i-q} \quad (31)$$

$$\beta_{i,b} = \begin{cases} 1 & \text{if } y_i \text{ such that } P_b \leq |x_i| < P_{b+1} \\ 0 & \text{otherwise} \end{cases} \quad (32)$$

This is equivalent to assuming the same functional form for the amplifier inverse $A^{-1}$, the differences are in the value for the coefficients and for the modulus bins. From this assumption and (30) we can write:

$$z_i = \sum_{q=0}^{Q-1} \sum_{m=0}^{M-1} \hat{D}_{m,q} \beta_{i-q,m} y_{i-q} \quad (33)$$

$$\beta_{i,b} = \begin{cases} 1 & \text{if } y_i \text{ such that } M_b \leq |y_i| < M_{b+1} \\ 0 & \text{otherwise} \end{cases} \quad (34)$$

Now if the pre-distortion has linearised the equations we use $y_i = Gx_i$ to give:

$$z_i = \sum_{m=0}^{M-1} \sum_{q=0}^{Q-1} \hat{D}_{m,q} G x_{i-q} \beta_{i-q,m} \quad (35)$$

$$\beta_{i,b} = \begin{cases} 1 & \text{if } y_i \text{ such that } M_b \leq |Gx_i| < M_{b+1} \\ 0 & \text{otherwise} \end{cases} \quad (36)$$

i.e. we have $G\hat{A}_{m,q} = D_{m,q}$ and $$\frac{1}{G} M_b = P_b$$

where G is the gain.

Figure 14:
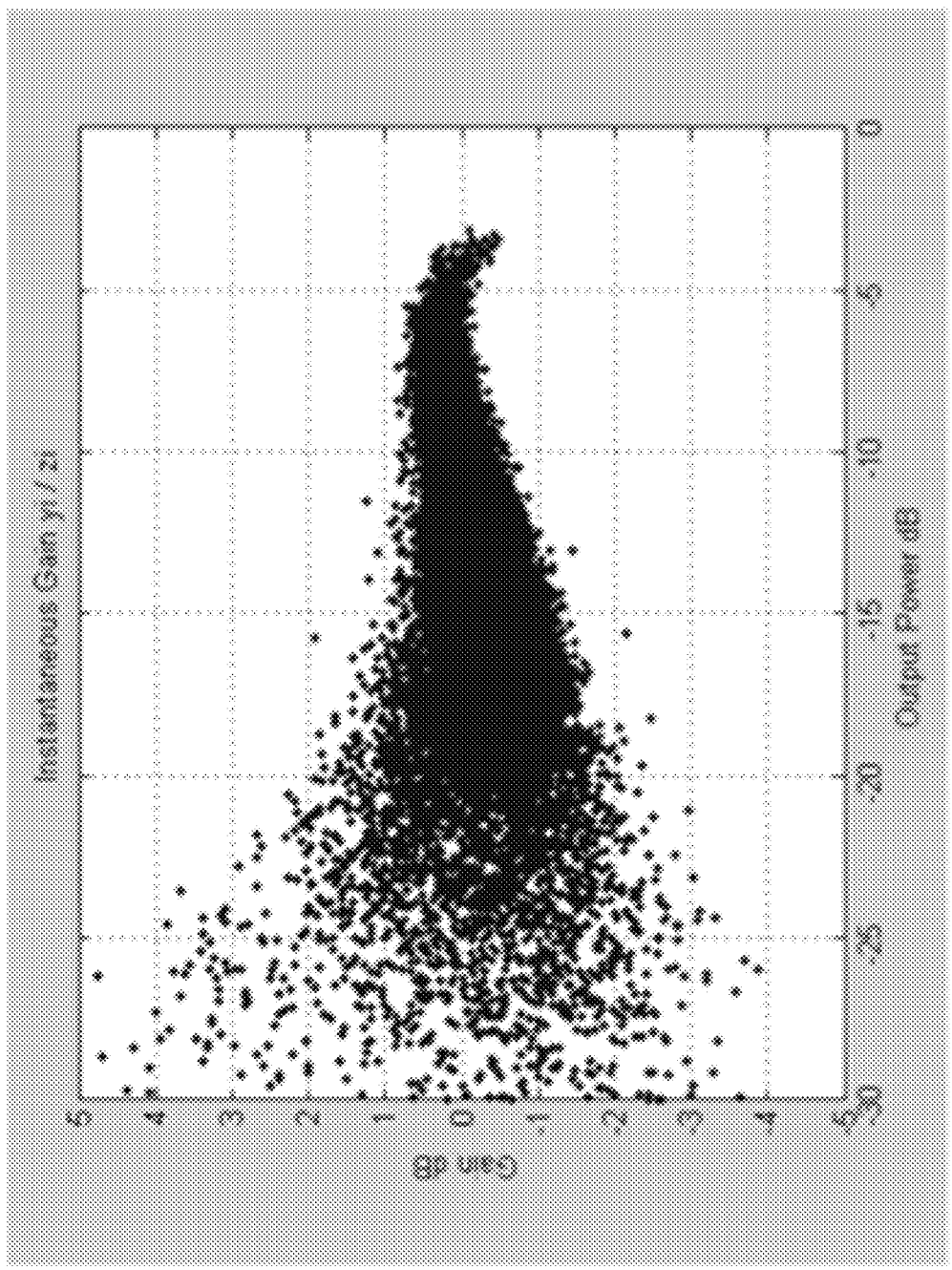
FIG. 14 depicts a data plot of a power amplifier instantaneous gain function.

Considering equation (33) as $z_i$ and $y_i$ are knows we can use least squares to find a set of coefficients $\hat{D}_{m,q}$ to minimize the error between the actual $z_i$ and estimated $\hat{z}_i$ Although it would be possible to find the coefficient set $\hat{D}_{m,q}$ using a least squares approach, as previously discussed the number of magnitude bins M is typically 256, and the Q value can range from 1 to 4, therefore it requires the solution of a M·Q set of linear equations which is impractical for low cost and/or low power implementations where the resources which can be reasonably be allocated are limited, such as within an FPGA implementation. To resolve this problem two novel approaches are proposed which achieve acceptable pre-distorter accuracy while significantly reducing the required microprocessor memory requirements and solution times within acceptable bounds. FIG. 14 illustrates the typical characteristics of power amplifier gain ($y_i/z_i$) verses output power on a sample per sample basis for a typical wireless infrastructure power amplifier It is shown that although the pre-distorter may require 256 magnitude bands to achieve sufficiently low quantization noise the PA characteristic can be well approximated with far fewer magnitude bands as the gain characteristic varies relatively smoothly verses output power.

Therefore the following two approaches are proposed:

(1) Define a simplified version of the pre-distortion function D, referred to as D' which has B magnitude bands, where B is much less than M. Therefore we can write in a similar manor to equation (33):

$$z_i = \sum_{q=0}^{Q-1} \sum_{b=0}^{B-1} D'_{b,q} \beta_{i-q,b} y_{i-q} \quad (37)$$

We can use a least squares approach to find the best set of coefficients $\hat{D}'_{b,q}$. As B<M we use linear interpolation to derive $\hat{D}_{m,q}$ from $\hat{D}'_{b,q}$ where the linear interpolation is applied independently for each value of q as follows:

$$\hat{D}_{2Mb+m,q} = \begin{cases} \hat{D}'_{0,q} & \text{if } b = 0 \text{ and } m < 0 \\ \hat{D}'_{b,q} & \text{if } b = B-1 \text{ and } m \geq 0 \\ \hat{D}'_{b,q} + \frac{m}{2M}(\hat{A}_{b-1,q} - \hat{A}_{b,q}) & \text{if } -M < m < 0 \\ \hat{D}'_{b,q} + \frac{m}{2M}(\hat{A}_{b+1,q} - \hat{A}_{b,q}) & \text{if } 0 \leq m < M \end{cases} \quad (38)$$

Practical experiments have shown a B value of 16-32 gives good pre-distortion performance. The memory space required and computational time is much reduced by solving B·Q linear equations following by linear interpolation for each q value, as opposed solving directly B·M linear equations. Such reduced memory and computational requirements may be particularly suitable for deployment within an FPGA.

(2) Derive a modified set of equations which fit a piece-wise-continuous set of straight line segments which can be solved in an identical least squares error minimisation method.

The following sections describe in further detail the two approaches, approach (1) will be referred to as Discrete DPD estimation, approach (2) Linear DPD estimation.

Discrete DPD Estimation

As previously described the estimation process has been split into two steps, first optimizing a pre-distorter function with B magnitude bands (typically 16-32) to find $\hat{D}'_{b,q}$, and subsequently performing a linear interpolation for each q values to obtain $\hat{D}_{m,q}$.

The coefficients $\hat{D}'_{b,q}$ could be found using a least squares approach where a batch of z and y samples, typically 16000 samples, can be used to find the B·Q coefficients. Therefore one must solve an over determined matrix equation with many more single equations than actual coefficients. This approach applies to a polynomial pre-distorter function as outlined in [1] of the pre-distorter block description. However this approach requires the formation of a matrix with B*Q*N elements, typically 16*4*16000 elements, and assuming each element can be held using 32 bits, this will require more than 32 Mbytes of memory space, much more than would normally be available in a low cost/low power deployment, such as one associated with a microprocessor embedded within an FPGA.

The proposed method shows that by use of appropriate substitutions, the dimensions of the matrix and vectors used to form the equation can be reduced and made independent of N. This has two major advantages which are firstly that the reduced memory requirements makes achieving a highly efficient and effective embodiment while keeping cost and power low feasible, such as may be suitable for implementation on a microprocessor embedded in an FPGA, and secondly that the number of samples used to estimate can be increased to improve averaging leading to a more accurate estimation without increasing the memory requirements or computation time.

The first step of the estimation process is to estimate $\hat{D}'_{b,q}$ in the least squares sense which leads to the following definitions:

$$Err = \sum_{i=0}^{N-1} \left| z_i - \sum_{b=0}^{B-1} \sum_{q=0}^{Q-1} D'_{b,q} y_{i-q} \beta_{i-q,b} \right|^2 \quad (39)$$

The partial differentials are zero at the point of minimum error i.e.

$$\frac{\partial Err}{\partial D_{n,m}} = 0 \quad (40)$$

Giving:

$$0 = \sum_{i=0}^{N-1} \left\{ z_i - \sum_{b=0}^{B-1} \sum_{q=0}^{Q-1} D'_{b,q} y_{i-q} \beta_{i-q,b} \right\} \overline{y_{i-n}} \beta_{i-n,m} \quad (41)$$

Or equivalently:

$$\sum_{i=0}^{N-1} z_i \overline{y_{i-n}} \beta_{i-n,m} = \sum_{b=0}^{B-1} \sum_{q=0}^{Q-1} D'_{b,q} \left\{ \sum_{i=0}^{N-1} y_{i-q} \beta_{i-q,b} \overline{y_{i-n}} \beta_{i-n,m} \right\} \quad (42)$$

Writing:

$$K_{b,q,m,n} = \sum_{i=0}^{N-1} y_{i-q} \beta_{i-q,b} \overline{y_{i-n}} \beta_{i-n,m} \quad (43)$$

and:

$$H_{m,n} = \sum_{i=0}^{N-1} z_i \overline{y_{i-n}} \beta_{i-n,m} \quad (44)$$

Which gives:

$$H_{m,n} = \sum_{b=0}^{B-1} \sum_{q=0}^{Q-1} D'_{b,q} K_{b,q,m,n} \quad (45)$$

Combining the indices by setting: $\mu = Bq+b$ and $\nu = Bm+n$ and using bold font to show using the new indexing scheme:

$$\mathbf{H}_\nu \sum_\mu \mathbf{D}'_\mu \mathbf{K}_{\mu,\nu} \quad (46)$$

which is a standard linear equation problem which can be solved using conventional methods such as Gaussian elimination with pivoting to aid numerical stability.

The square matrix K contains $(B \times Q)^2$ elements and vectors H and D' both have B×Q elements. Taking our typical values of B=16 and Q=4 and assuming each element can be held using 32 bits, this will require 132 Kbytes of memory space which is only 0.4% of the memory required by the previous approach and likely small enough to provided by the limited memory resources available in a FPGA or similar deployment. The calculation time for this approach depends on the choice of B and Q with order $$O\left(\frac{2}{3}(BQ)^3\right).$$

The other key advantage of this approach is that each element of H and K is a summation, meaning that when each sample is consumed it can simply be accumulated with values from previous samples. This means that instead of requiring one large set of samples for $z_i$ and $y_i$ with a typical value of N in the range 16384-32768 we can use 16-32 sets of captures $z_{1:N}$ and $y_{1:N}$ with a value of N of 1024 to populate H and K. This reduces the size of the capture buffers which reduces the maximum memory requirements, and also gives great flexibility in the number of samples that are used for estimation, allowing a trade off between increased accuracy from more averaging or faster update times due to having to collect fewer samples.

The solution to the above equations provides the complex coefficients $D'_{b,q}$ corresponding to the estimation bands B, which are then linearly interpolated to provide the values for the magnitude bands as previously described by equation (38).

Linear DPD Estimation

The function $\beta_{i,b}$ used in the approach outlined in the Discrete DPD Estimation section is used to place the samples $y_i$ into one of the estimation bands b. Once placed in an estimation band all samples in that band are treated as having the same magnitude for the purposes of the calculation, and that magnitude is equal to the mean of the upper and lower magnitude bounds for that estimation band.

One limitation of this approach is that it takes no account of the distribution of the magnitudes of the samples which are placed into a given estimation band. In fact, a typical signal will have a larger number of samples falling into the bands in the middle than at either the higher or lower magnitude ends, and as a result the bands at each end tend to contain a distribution of samples whose magnitudes are skewed towards the upper bound in the lower estimation bands and towards the lower bound in the upper estimation bands. This means that mean of the upper and lower magnitude bounds of the band is not an accurate representation of the mean magnitude of the samples used to calculate the coefficient.

A novel improvement is to define a pre-distortion function as a piecewise continuous mapping of input to output signal. Instead of placing a sample in a single estimation band thereby associating it with the central magnitude value of that band, we consider the impact of the sample on the two estimation bands between which it falls.

This may require that we add a weighted offset $O_{b,q}$ which depends on how far into estimation band b sample $y_i$ lies, so rewriting equation 37:

$$Err = \sum_{i=0}^{N-1}\left|z_i - \sum_{q=0}^{Q-1}\sum_{b=0}^{B-1} y_{i-q}\beta_{i-q,b}\left\{D'_{b,q} + O_{b,q}(|y_{i-q}| - M_b)\right\}\right|^2 \quad (47)$$

where $M_b$ is the lower bound of estimation band b. We choose O values so there are no discontinuities between the coefficient value calculated for one estimation band and the next:

$$D'_{b,q} + O_{b,q}(M_{b+1} - M_b) = D'_{b+1,q} \quad (48)$$

I.e.

$$O_{b,q} = \frac{D'_{b+1,q} - D'_{b,q}}{M_{b+1} - M_b} \quad (49)$$

We therefore have to find Q(B+1) coefficients.

$$Err = \sum_{i=0}^{N-1}\left|z_i - \sum_{q=0}^{Q-1}\sum_{b=0}^{B-1} y_{i-q}\beta_{i-q,b}\left\{D'_{b,q} + \left(\frac{D'_{b+1,q} - D'_{b,q}}{M_{b+1} - M_b}\right)(|y_{i-q}| - M_b)\right\}\right|^2 \quad (50)$$

Which can be re-arranged to give:

$$Err = \sum_{i=0}^{N-1}\left|z_i - \sum_{q=0}^{Q-1}\sum_{b=0}^{B} y_{i-q}\rho_{i,q,b}D'_{b,q}\right|^2 \quad (51)$$

where $$\rho_{i,q,b} = \begin{cases} \beta_{i-q,0}\left(\frac{M_1 - |y_{i-q}|}{M_1 - M_0}\right) & \text{if } b = 0 \\ \beta_{i-q,b}\left(\frac{M_{b+1} - |y_{i-q}|}{M_{b+1} - M_b}\right) + \\ \beta_{i-q,b-1}\left(\frac{|y_{i-q}| - M_{b-1}}{M_b - M_{b-1}}\right) & \text{if } 0 < b < B \\ \beta_{i-q,B-1}\left(\frac{|y_{i-q}| - M_{B-1}}{M_B - M_{B-1}}\right) & \text{if } b = B \end{cases} \quad (52)$$

Again estimate the coefficients $D'_{b,q}$ by minimising the error function, the partial differentials are zero at the point of minimum error i.e.

$$\frac{\partial Err}{\partial D'_{n,m}} = 0 \quad (53)$$

Applying this to equation 50 gives:

$$0 = \sum_{i=0}^{N-1}\left\{z_i - \sum_{b=0}^{B}\sum_{q=0}^{Q-1} D'_{b,q}y_{i-q}\rho_{i,q,b}\right\}\overline{y_{i-n}\rho_{i,n,m}} \quad (54)$$

I.e.

$$\sum_{i=0}^{N-1} z_i\overline{y_{i-n}\rho_{i,n,m}} = \sum_{b=0}^{B}\sum_{q=0}^{Q-1} D'_{b,q}\sum_{i=0}^{N-1}(y_{i-q}\rho_{i,q,b}\overline{y_{i-n}\rho_{i,n,m}}) \quad (55)$$

By using suitable substitutions we can write:

$$K_{b,q,m,n} = \sum_{i=0}^{N-1} y_{i-q}\rho_{i,q,b}\overline{y_{i-n}\rho_{i,n,m}} \quad (56)$$

-continued $$H_{m,n} = \sum_{i=0}^{N-1} z_i \overline{y_{i-n}} \rho_{i,n,m}$$

We have:

$$H_{m,n} = \sum_{b=0}^{B} \sum_{q=0}^{Q-1} D'_{b,q} K_{b,q,m,n} \quad (57)$$

Combining the indices by setting: μ=Bq+b and ν=Bm+n and using bold font to show using the new indexing scheme:

$$H_\nu \sum_\mu D'_\mu K_{\mu,\nu} \quad (58)$$

which is a standard linear equation problem which can be solved using conventional methods such as Gaussian elimination with pivoting to aid numerical stability. Memory requirements and calculation time are the same as for the discrete DPD approach with the exception that we are now have B+1 estimation bands.

Having found by least squares error minimisation the best coefficients $D'_\mu$ which satisfy:

$$H_\nu = \Sigma_\mu D'_\mu K_{\mu,\nu} \quad (59)$$

we then un-pick the equations to recover $D'_{b,q}$ where:

$$D'_{b,q} = D'_\mu \text{ where } \mu = Bq+b \quad (60)$$

Recall that the coefficients $D'_{b,q}$ are used to define a piecewise-continuous curve formed from straight line segments.

$$z_i = \sum_q \sum_b y_{i-q} \beta_{i-q,b} \{D'_{b,q} + O_{b,q}(|y_{i-q}| - M_b)\} \quad (61)$$

And $$\beta_{i,b} = \begin{cases} 1 & \text{if } y_i \text{ such that } M_b \leq |y_i| < M_{b+1} \\ 0 & \text{otherwise} \end{cases} \quad (62)$$

The requirement for continuity gives us that:

$$O_{b,q} = \frac{D'_{b+1,q} - D'_{b,q}}{M_{b+1} - M_b} \quad (63)$$

And $M_{b+1} - M_b$ is the width of the modulus bin.

If we wish to determine the values for a finer granularity of modulus bin—e.g. so fine that we can treat the modulus values as constant with acceptable error—we interpolate as follows.

Suppose we divide each modulus bin into N equal parts. Then:

$$z_i = \sum_q \sum_b \sum_{n=0}^{N-1} y_{i-q} \beta_{i-q,Nb+n} \left\{ D'_{b,q} + O_{b,q}\left(M_b + \frac{n}{N}\left(\frac{M_{b+1}-}{M_b}\right) - M_b\right) \right\} \quad (64)$$

And $$\beta_{i,Nb+n} = \begin{cases} 1 & \text{if } y_i \text{ such that } M_b + \frac{n}{N}\left(\frac{M_{b+1}-}{M_b}\right) \leq \\ & |y_i| < M_b + \frac{n+1}{N}\left(\frac{M_{b+1}-}{M_b}\right) \\ 0 & \text{otherwise} \end{cases} \quad (65)$$

which simplifies down to:

$$z_i = \sum_q \sum_b \sum_{n=0}^{N-1} y_{i-q} \beta_{i-q,Nb+n} \left\{ D'_{b,q} + \frac{n}{N}(D'_{b+1,q} - D'_{b,q}) \right\} \quad (66)$$

Or equivalently if we only want a double summation, using the floor operator $\lfloor w \rfloor$ we have:

$$z_i = \sum_q \sum_{b=0}^{NB} y_{i-q} \beta_{i-q,b} \left\{ D'_{\lfloor b/N \rfloor,q} + \frac{n}{N}(D'_{\lfloor b/N \rfloor+1,q} - D'_{\lfloor b/N \rfloor,q}) \right\} \quad (67)$$

$$\beta_{i,b} = \begin{cases} 1 & \text{if } y_i \text{ such that } M_b^{(n)} \leq |y_i| < M_b^{(n+1)} \\ 0 & \text{otherwise} \end{cases} \quad (68)$$

Where $$M_b^{(n)} = M_{\lfloor b/N \rfloor} + \frac{n}{N}(M_{\lfloor b/N \rfloor+1} - M_{\lfloor b/N \rfloor}) \quad (69)$$

Note that this is the functional form of the pre-distorter, equation (69 so we have identified the pre-distorter coefficients $D_{m,q}$ Discrete DPD Estimation with Different Numbers of Estimation Bands in Each Delay Term In some cases where memory resources are extremely constrained it may be beneficial to use less estimation bands in the delay taps as they will have less effect on the model accuracy than the primary tap. Shown here is a method for achieving this. It should be noted that this can be applied equally well to the Linear DPD Estimation if required.

Having different numbers of bands per taps gives a modified form of equation 37:

$$Err = \sum_{i=0}^{N-1} \left| z_i - \sum_{b=0}^{B^{(q)}-1} \sum_{q=0}^{Q-1} D'_{b,q} y_{i-q} \beta^{(q)}_{i-q,b} \right|^2 \quad (70)$$

where the function $\beta_{i,b}^{(q)}$ gives the power band on the $q^{th}$ tap:

$$\beta_{i,b}^{(q)} = \begin{cases} 1 & \text{if } y_i \text{ in power band } b \text{ of the } q^{th} \text{ tap} \\ 0 & \text{otherwise} \end{cases} \quad (71)$$

Suppose we choose equally spaced estimation bands and the number of bands being a multiple of a power of 2—so on the primary tap we have a band size of K. This therefore gives:

B bands on the primary tap of size K
B/2 bands on the second tap of size 2K
B/4 bands on the third tap of size 4K If we calculate the $\beta_{i,q}$ function for the bands on the primary tap then we have:

$$\beta_{i,b}^{(q)} = \left\lfloor \frac{\beta_{i,b}}{2^q} \right\rfloor \quad (72)$$

For example if given certain memory constraints we may have 4 taps with 32, 16, 8 and 4 bands on them. This gives 60 coefficients to solve rather than 128 if we had to have 32 bands on all taps. As a result, memory requirements and calculation time are the similar as for the discrete DPD approach but we replace BQ with the reduced number of coefficients we are finding.

Fast DPD Estimation

Normally a PA model which does not consider delayed versions of samples will achieve the majority of the correction performance, perhaps 80-90% when compared to a model which does compensate for the PA memory. The advantage of this type of approach is that the problem is hugely simplified as it no longer includes a matrix inversion to generate the coefficients, meaning that it requires much less memory for the data structures and computation time is massively reduced. This can therefore be used when the update time of the estimation is critical such as when the DPD is started up and several iterations need to be completed very quickly.

The equation for which we need to find an estimated solution is adapted from equation 37 by setting Q=1, so the error equation we need to minimise is:

$$Err = \sum_{i=0}^{N-1} \left| z_i - \sum_{b=0}^{B-1} D_b' y_i \beta_{i,b} \right|^2 \quad (73)$$

The partial differentials are zero at the point of minimum error i.e.

$$\frac{\partial Err}{\partial D_{n,m}} = 0 \quad (74)$$

Giving:

$$0 = \sum_{i=0}^{N-1} \left\{ z_i - \sum_{b=0}^{B-1} D_b' y_i \beta_{i,b} \right\} \overline{y_i} \beta_{i,n} \quad (75)$$

Note that, by definition of $\beta_{i,b}$ we have that $\beta_{i,b}\beta_{i,n}$ is only non-zero when b=n (since a sample value can only be in one estimation band) so equation 56 gives:

$$0 = \sum_{i=0}^{N-1} \{z_i - D_n' y_i\} \overline{y_i} \beta_{i,n} \quad (76)$$

i.e.

$$\sum_{i=0}^{N-1} z_i \overline{y_i} \beta_{i,n} = D_n' \sum_{i=0}^{N-1} |y_i|^2 \beta_{i,n} \quad (77)$$

As $\beta_{i,b}$ is zero unless $y_i$ is in estimation band b then this gives:

$$D_n' = \frac{\sum_i s.t.\ y_i \text{ in band } n\ z_i \overline{y_i}}{\sum_i s.t.\ y_i \text{ in band } n\ |y_i|^2} \quad (78)$$

which is extremely simple and quick to solve. The data space required for this approach is only 2B elements required to perform the accumulations, which assuming B=16 and elements are of 32-bits we would need just 128 bytes of memory space compared to 132 Kbytes for the discrete DPD approach discussed in the Discrete DPD Estimation section. The calculation time required to solve this equation has a linear relationship with B.

System Control

A system control process, typically implemented in a soft core microprocessor, handles the sequencing and control of estimations for both the pre-distortion and QMC functions. The PA response can be affected by changes in RF power or frequency and temperature of the PA devices. The ability of the system to generate an accurate model of the response can also be affected by the range of values and the level of noise present in the y and z signals used in the estimation. The task of the system control process is to manage the QMC and pre-distortion updates with the intention of generating and maintaining the most accurate models under all operating conditions.

In order to maintain a good signal to noise ratio at the ADC input 108 a variable RF attenuator is usually included in the RF down-conversion block. This means that if the average RF output power at the transmitter output is set to a low value the attenuation can be reduced to boost the signal at the ADC input, and likewise when the average RF output power is set to a high value the attenuation can be increased to prevent the signal from exceeding the dynamic range of the ADC. To achieve a suitable signal level at the ADC a calibration process is included to set the attenuator at a level such that there is a fixed gain between the digital signal sent to the DAC 103 and the digital signal received at the ADC 108. To do this the system uses captured data for the y and z signals and calculates the difference in power between them, which is equivalent to the gain from 103 to 108. The system then calculates the adjustment to the attenuator value that will achieve the required fixed gain relationship and applies it to the attenuator. The calibration measurement is then repeated until the gain is close to the desired value.

If the RF gain between the output of the DAC 103 and the output of the PA 106 is changed, for example to set a different average RF power output of the transmitter, then the PA will be exercised over a different power range and the calculated model of the pre-distorter will no longer be valid. Also, if this value changes while estimation is in progress then the sample data used for the estimation will be corrupted. If the RF frequency is changed then this will also change the response of the PA and mean the calculated model will be invalid. Under normal operation these variables will be changed infrequently and at the request of the process that manages the whole transmitter system. For this reason the DPD system provides the facility for this superior managing system to control its behaviour by selecting either single estimations or an autonomous tracking mode. To assist in debug and test operations the DPD system also provides access to many of its internal operations individually and can report information and captured samples from the system for external analysis.

Figure 8:
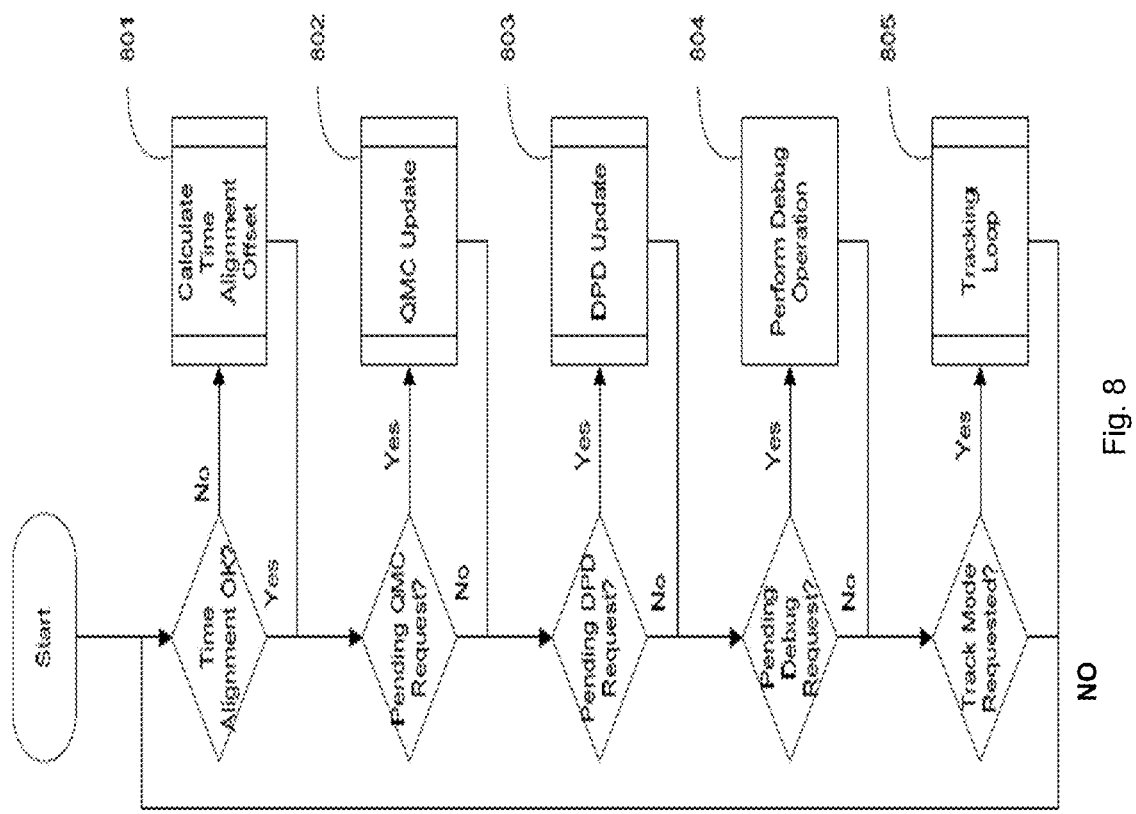
FIG. 8 depicts a flow diagram of an embodiment of control operation of the invention.
Figure 9:
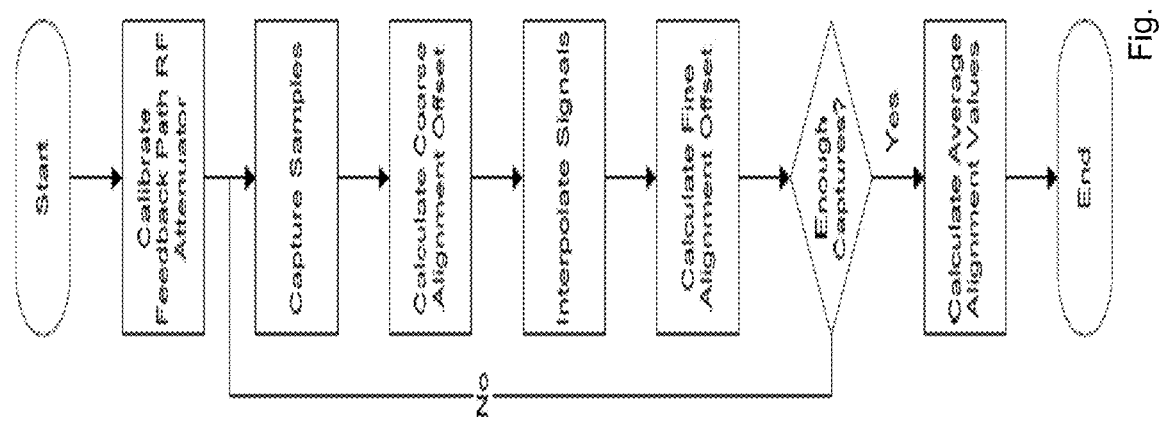
FIG. 9 depicts a flow diagram of a generalized time alignment function of the invention.
Figure 10:
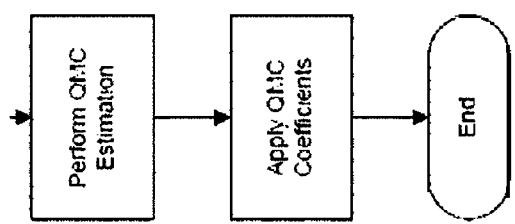
FIG. 10 depicts a flow diagram of a QMC time alignment function of the invention.
Figure 10:
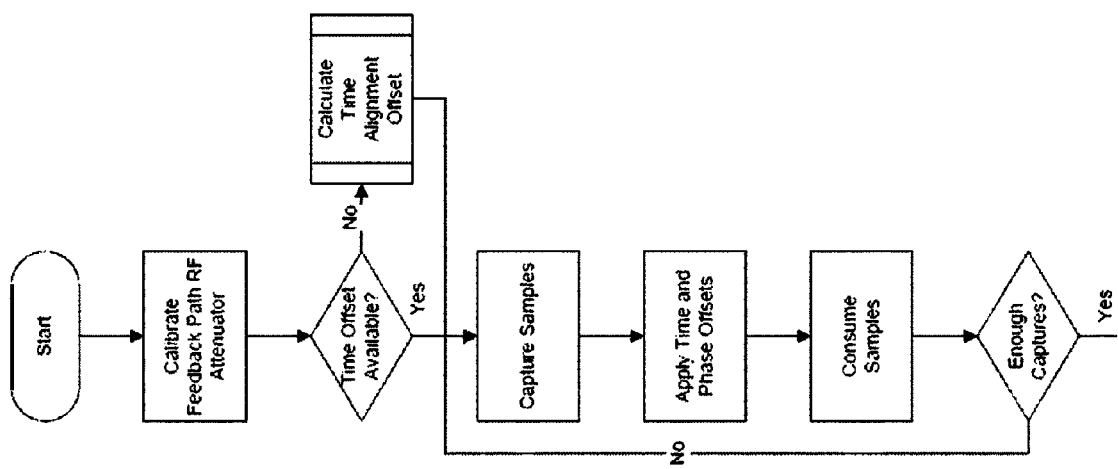
Figure 11:
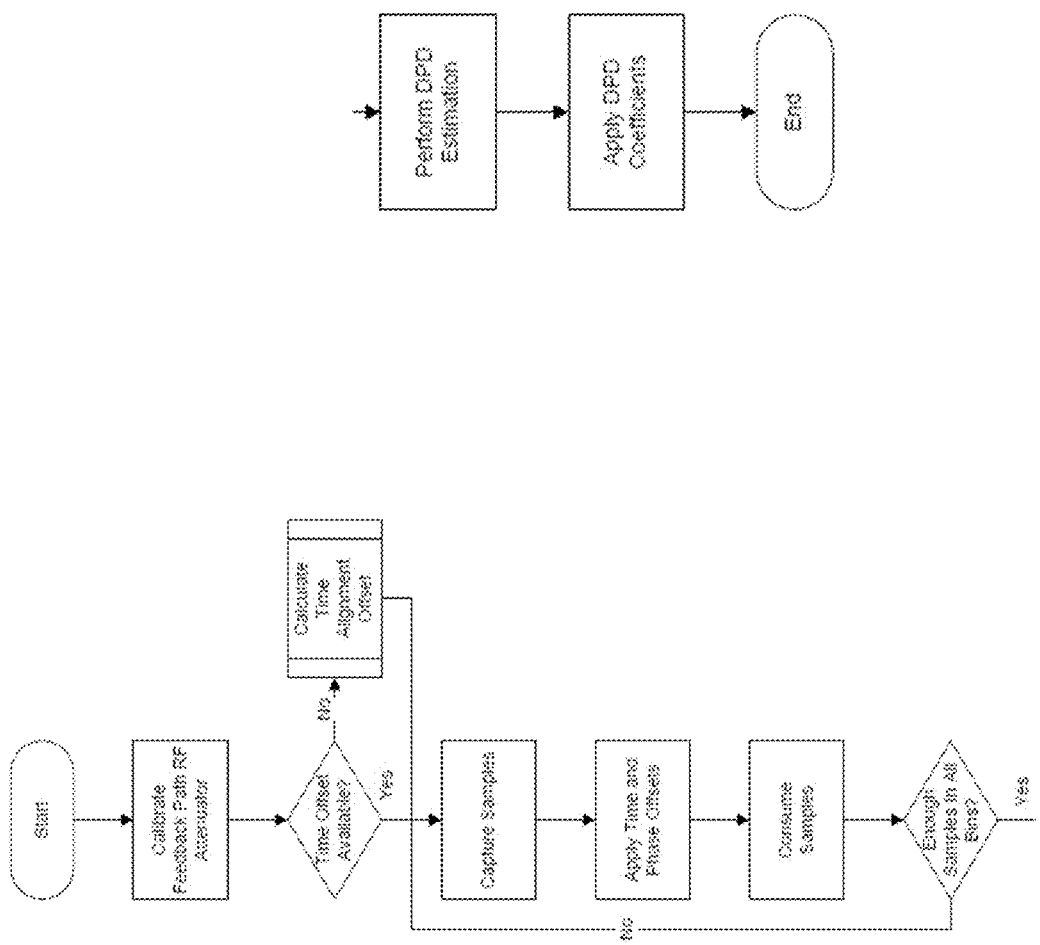
FIG. 11 depicts a flow diagram of a pre-distorter time alignment function of the invention.

Single estimations would normally be used when the superior controller is changing the parameters of the transmitter system such as RF frequency or gain. This prevents the DPD system from attempting estimation while these parameters are being changed, and the superior controller can then request that the DPD system performs one or more estimation cycles once the parameter values are stable. Typically the request would be for a fast estimation to allow rapid convergence before enabling the tracking mode to achieve a more accurate estimation once the transmitter is in a steady state. A typical implementation of the top-level control loop is shown in FIG. 8. This shows the different options that are available to the external system controller which include a time alignment offset calculation 801, a QMC update 802, a pre-distorter update 803, a debug operation 804, or entering the tracking loop 805. The debug operations are not detailed here but are included with the intention of providing external access to the variables used in the estimation processes to assist in algorithm development and fault diagnosis. FIGS. 9, 10 and 11 detail the steps involved in updating the time alignment offset calibration, the QMC and the pre-distortion models.

Figure 12:
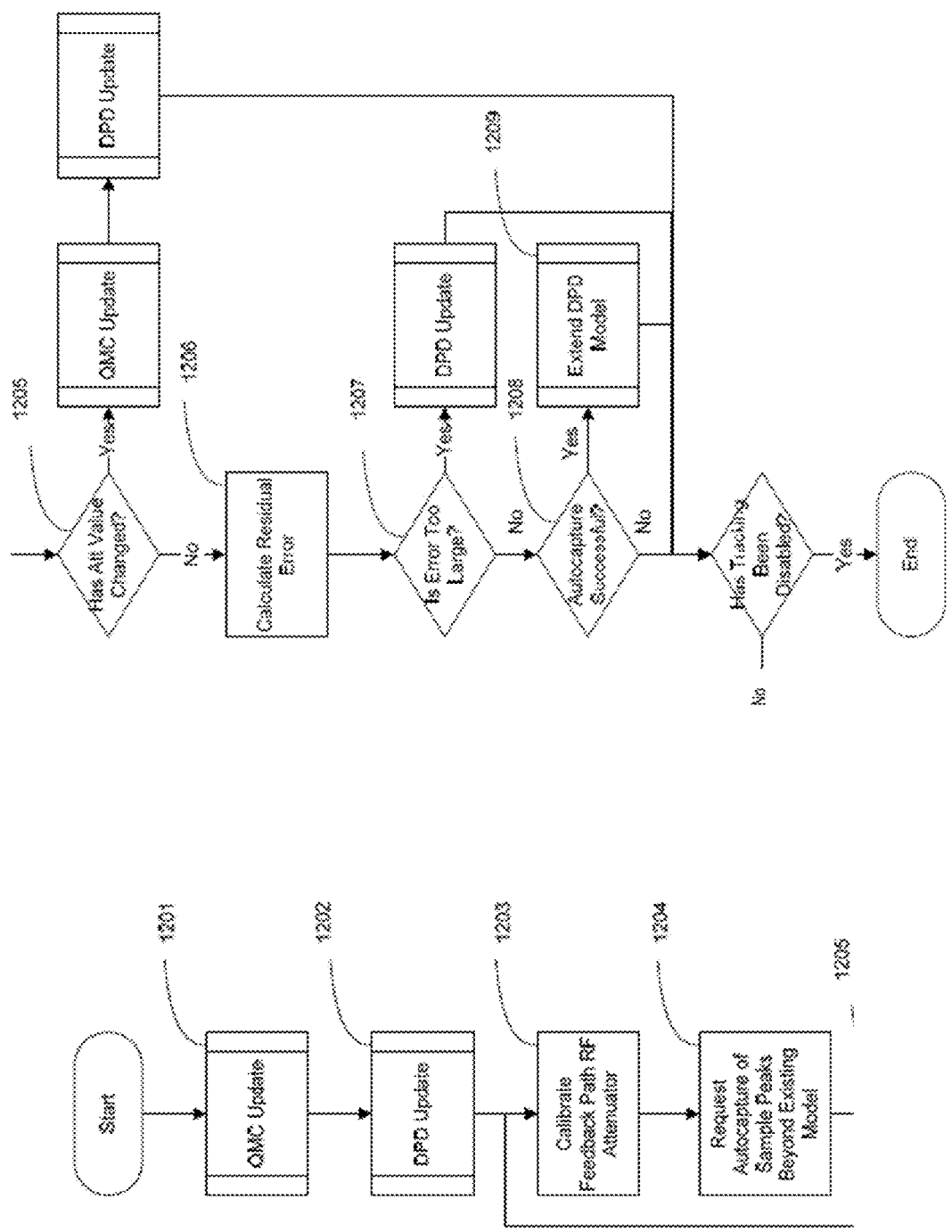
FIG. 12 depicts a flow diagram of a tracking mode function of the invention.

Tracking mode would normally be used when the transmitter is set to a constant RF frequency and the gain from the DAC 103 to the PA output 106 is maintained at a constant value. In this mode the aim is to collect data over the widest possible range of sample powers and maintain an accurate model of the PA response at all times. The speed of estimation is less of a concern here as the assumption is that the PA response varies little over time. FIG. 12 shows a typical implementation of the tracking mode.

When the system enters this mode a number of estimation iterations are called for the QMC 1201 and the pre-distortion 1202 to reach a good model of the PA response, after which the system will not update the model unless there is evidence that an update is required. This evidence can come from one of three sources, the most important of which is a measure of the accuracy of the current model called the residual error 1206. This is a figure of merit calculated by capturing a set of samples for the y and z signals, applying the calculated model to the y signal to give an estimate of the z signal, and then calculating the variance between this estimate and the true z signal.

$$Err = \sum_{i=0}^{N-1} \left| z_i - \sum_{m=0}^{M} \sum_{q=0}^{Q-1} D_{m,q} \alpha_{i,m} y_{i-q} \right|^2 \qquad (79)$$

If the current model is accurate the figure will be small, if the model is inaccurate and needs updating the figure is large. The system control process regularly calculates the residual error and if it increases above a defined level 1207 one or more estimation cycles will be called to improve the model.

The second source of evidence that can cause an update is the gain of the RF feedback path from the coupler 106 to the ADC 108. A change in the gain of this path suggests that the ambient temperature in the transmitter has changed and the calculated model may no longer be accurate. The gain of the feedback path is controlled to maintain good signal level at the ADC input by an adjustable RF attenuator in the RF down converter 107, the value of which is set by means of a calibration procedure 1203 mentioned previously. The control system calls this recalibration process regularly and watches for a change in the calculated attenuation value 1205, indicating a significant temperature change. One or more estimation cycles will then be called to improve the model.

Figure 13:
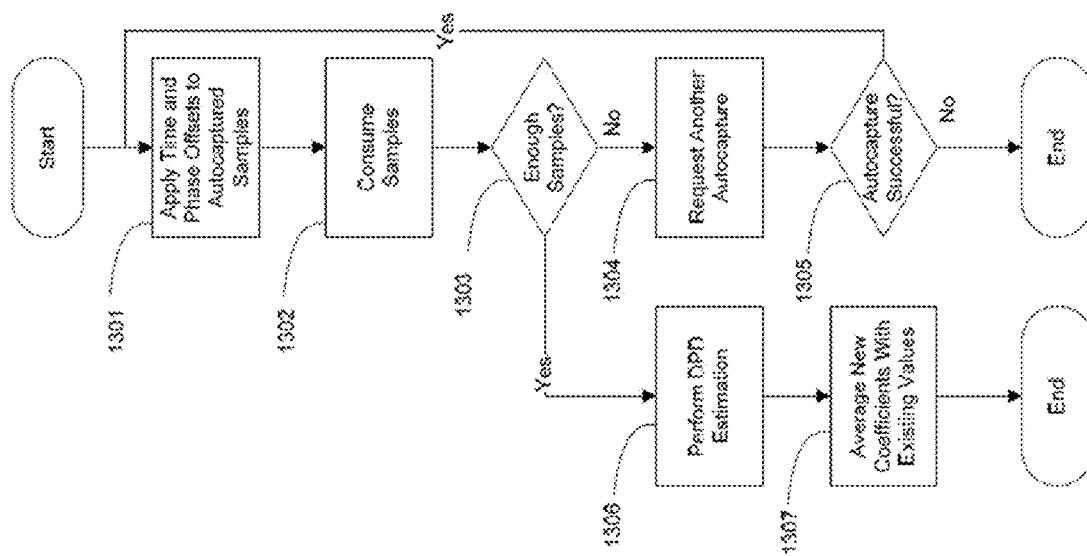
FIG. 13 depicts a flow diagram of a model update function of the invention.

The third source of evidence that can cause an update is the maximum magnitude of the digital baseband IQ samples that make up the x signal. If the magnitude of a sample exceeds the range over which the system has estimated complex coefficients stored in the pre-distorter block look-up tables then the PA will be exercised over an area that has not been characterised in the calculated model. This can be detected by the control system enabling the autocapture system with the capture_threshold figure set to the maximum magnitude for which we have previously estimated 1204 and monitoring for a successful capture 1208. If a capture occurs the control system will call a subroutine to extend the range of the pre-distortion model 1209 which is detailed in FIG. 13. The system will firstly align 1301 and consume 1302 the samples from the autocapture, before checking if there are sufficient samples in the magnitude bands for estimation 1303. If not the autocapture system is enabled again 1304 and providing more data can be captures 1305 the loop repeats until there is sufficient data for estimation 1306. The resulting coefficients are then averaged with the existing coefficients of the model 1307 to extend the upper range of magnitudes over which the model is valid.

FIG. 14 illustrates a plot of data points of a radio frequency high power amplifier instantaneous gain as a function of output power versus gain.

Figure 15:
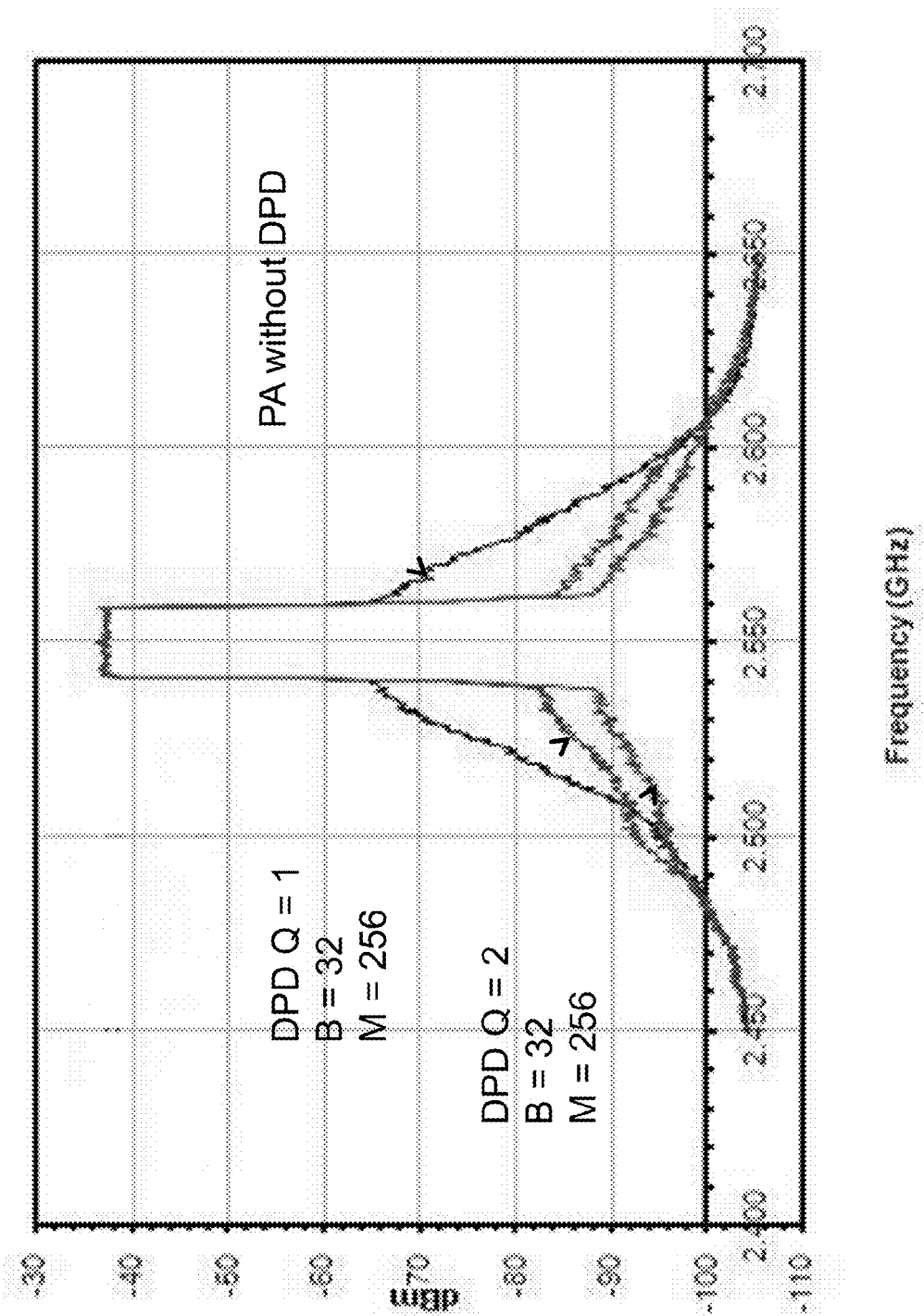
FIG. 15 depicts a plot of sampled data from a prototype embodiment of the invention.

FIG. 15 illustrates the actual measured DPD performance using the discrete DPD estimation approach with an actual power amplifier for different models, both with B=32 but with Q=1 and Q=2. The results indicated the proposed discrete DPD estimation approach achieve useful level of power amplifier linearization as indicated by the spectral re-growth improvement.

Figure 16:
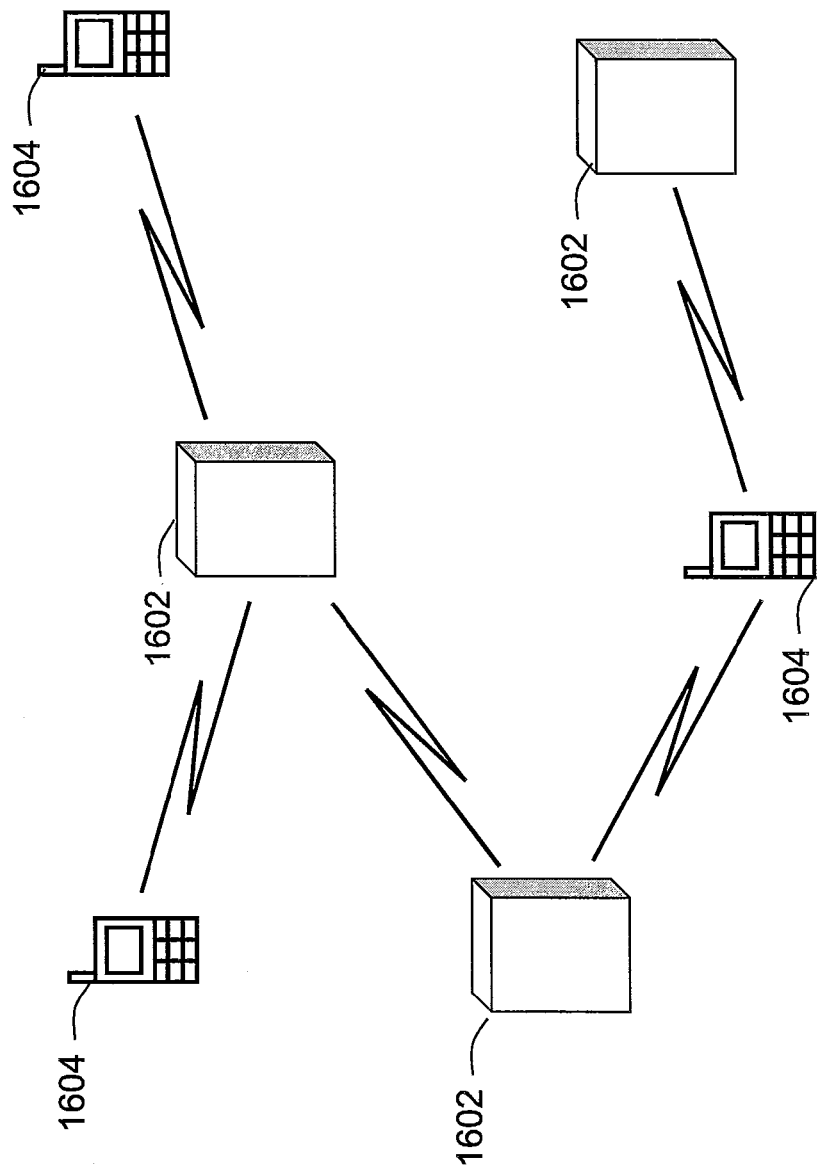
FIG. 16 depicts a block diagram of a mobile network application of the invention.

FIG. 16 illustrates a system level application of an embodiment of the invention in which a plurality of instances of the invention are associated with RF amplifiers to form wireless network nodes 1602 that are interconnected with wireless handsets 1604 (e.g. mobile phones) to form a wireless communication network.

The invention claimed is:
1. A method comprising:
providing a set of amplifier output samples for estimating a model of digital pre-distortion to compensate for amplifier non-linearity, the set comprising a plurality of subsets, each subset containing a plurality of samples at least one of which represents the subset peak value;
digitally capturing a new subset of amplifier output samples when a sample includes a peak value larger than a peak value in the set;
using a processor to determine one subset to be replaced by the new subset; and replacing the determined subset with the new subset.

* * * * *